(12) United States Patent
Kim et al.

(10) Patent No.: US 8,536,703 B2
(45) Date of Patent: Sep. 17, 2013

(54) SEMICONDUCTOR DEVICES AND ELECTRONIC SYSTEMS

(75) Inventors: Deok-Kee Kim, Yongin-si (KR);
Byeung-Chul Kim, Suwon-si (KR);
Hoon-Jeong, Hwaseong-si (KR);
Yong-Woo Kwon, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 220 days.

(21) Appl. No.: 13/052,614

(22) Filed: Mar. 21, 2011

(65) Prior Publication Data

US 2011/0233796 A1 Sep. 29, 2011

(30) Foreign Application Priority Data

Mar. 23, 2010 (KR) .................... 10-2010-0025989

(51) Int. Cl.
*H01L 23/48* (2006.01)
*H01L 23/52* (2006.01)
*H01L 29/40* (2006.01)

(52) U.S. Cl.
USPC ........................................ 257/750; 257/758

(58) Field of Classification Search
USPC ................... 257/750, 751, 758, 784
See application file for complete search history.

(56) References Cited

U.S. PATENT DOCUMENTS

| 7,439,536 B2 * | 10/2008 | Pellizzer et al. ............... 257/3 |
| 2002/0000665 A1 * | 1/2002 | Barr et al. ............... 257/758 |
| 2005/0272243 A1 * | 12/2005 | Yuzawa et al. ............... 438/613 |

FOREIGN PATENT DOCUMENTS

| KR | 1020090012027 A | 2/2009 |
| KR | 1020090015783 A | 2/2009 |
| KR | 1020090069772 A | 7/2009 |

* cited by examiner

*Primary Examiner* — S. V. Clark
(74) *Attorney, Agent, or Firm* — Myers Bigel Sibley & Sajovec, P.A.

(57) ABSTRACT

A semiconductor device and an electronic system are provided. The semiconductor device includes a lower conductive pattern, and an intermediate conductive pattern on the lower conductive pattern. An upper conductive pattern is provided on the intermediate conductive pattern and is electrically connected to the intermediate conductive pattern. The intermediate conductive pattern includes a first portion and a second portion that extends from a part of the first portion and that is disposed at a higher level from the lower conductive pattern than the first portion. The upper conductive pattern is disposed on the first portion of the intermediate conductive pattern and has a top surface that is disposed at a higher level from the lower conductive pattern than the second portion of the intermediate conductive pattern.

20 Claims, 22 Drawing Sheets

SEMICONDUCTOR DEVICES AND ELECTRONIC SYSTEMS

CROSS-REFERENCE TO RELATED APPLICATION

This application claims priority under 35 U.S.C. §119 to Korean Patent Application No. 10-2010-0025989 filed on Mar. 23, 2010, the disclosure of which is hereby incorporated by reference in its entirety.

BACKGROUND

1. Field

Embodiments of the inventive concept relate to semiconductor devices, and electronic systems.

2. Description of Related Art

To meet demand for increased performance and reduced power consumption of semiconductor memory devices, research into development of next-generation semiconductor memory devices including a ferroelectric random access memory (FRAM), a magnetic random access memory (MRAM) and a phase-change random access memory (PRAM) is underway. Materials constituting such next-generation semiconductor memory devices may exhibit a resistance that varies depending on a current or voltage, and even when a current or voltage supply is cut off, the materials may maintain their resistance, and thus, may continue to store information even when power is not supplied thereto. In particular, the PRAM structure, which uses a phase-change material to store information, may exhibit high operating speeds and may have a structure suitable for high integration density.

SUMMARY

Embodiments of the inventive concept provide a structure of a semiconductor device including a plurality of conductive patterns that may have improved resistance characteristics and methods of fabricating the same.

Embodiments of the inventive concept also provide an electronic system employing a semiconductor device including a plurality of conductive patterns with improved resistance characteristics.

The technical objectives of the inventive concept are not limited to the above disclosure; other objectives may become apparent to those of ordinary skill in the art based on the following descriptions.

In accordance with some embodiments of the inventive concept, a semiconductor device includes a lower conductive pattern, and an intermediate conductive pattern on the lower conductive pattern. An upper conductive pattern is provided on the intermediate conductive pattern and is electrically connected to the intermediate conductive pattern. The intermediate conductive pattern includes a first portion and a second portion that extends from a part of the first portion and that is disposed at a higher level from the lower conductive pattern than the first portion. The upper conductive pattern is disposed on the first portion of the intermediate conductive pattern and has a top surface that is disposed at a higher level from the lower conductive pattern than the second portion of the intermediate conductive pattern.

The lower conductive pattern may be formed of a metal-semiconductor compound.

An external sidewall of the intermediate conductive pattern may be vertically aligned with a sidewall of the lower conductive pattern.

The intermediate conductive pattern may have a greater width than the lower conductive pattern.

The first portion of the intermediate conductive pattern may cover a top surface of the lower conductive pattern, and the second portion of the intermediate conductive pattern may protrude upwardly from an end of the first portion of the intermediate conductive pattern.

The intermediate conductive pattern may further include a third portion interposed between the first portion and the second portion. The third portion of the intermediate conductive pattern may cover a sidewall of the lower conductive pattern.

The upper conductive pattern may be in contact with the first portion of the intermediate conductive pattern.

The upper conductive pattern may include a first portion on the first portion of the intermediate conductive pattern and that is disposed at a lower level than a top surface of the second portion, and a second portion that protrudes upwardly from a part of the first portion and that is disposed at a higher level from the lower conductive pattern than the top surface of the second portion of the intermediate conductive pattern.

The lower conductive pattern may include a first portion and a second portion that extends downwardly from an end of the first portion.

The device may further include a buffer pattern interposed between the second portion of the intermediate conductive pattern and the external sidewall of the upper conductive pattern.

In accordance with other embodiments of the inventive concept, an electronic system includes a control unit, and a storage unit. The storage unit includes a lower conductive pattern, an intermediate conductive pattern on the lower conductive pattern and electrically connected to the lower conductive pattern, and an upper conductive pattern on the intermediate conductive pattern and electrically connected to the intermediate conductive pattern. The intermediate conductive pattern includes a first portion and a second portion that protrudes upwardly from a part of the first portion and that is disposed at a higher level from the lower conductive pattern than the first portion, and the upper conductive pattern has a top surface on the first portion of the intermediate conductive pattern and that is disposed at a higher level from the lower conductive pattern than the second portion of the intermediate conductive pattern.

In accordance with still other embodiments of the inventive concept, a semiconductor device having an information storage material pattern includes a switching device. The switching device includes a first impurity region and a second impurity region on the first impurity region. A lower conductive pattern is provided on the second impurity region. An intermediate conductive pattern is provided on the lower conductive pattern. An upper conductive pattern is provided on the intermediate conductive pattern. An information storage material pattern is provided on the upper conductive pattern. The intermediate conductive pattern includes a first portion and a second portion that extends from a part of the first portion and that is disposed at a higher level than the first portion, and the upper conductive pattern is on the first portion of the intermediate conductive pattern and has a top surface disposed at a higher level from the lower conductive pattern than the second portion.

The lower conductive pattern may be formed of a metal-semiconductor compound.

An external sidewall of the intermediate conductive pattern may be vertically aligned with a sidewall of the lower conductive pattern.

The intermediate conductive pattern may have a greater width than the lower conductive pattern.

The first portion of the intermediate conductive pattern may cover a top surface of the lower conductive pattern, and the second portion of the intermediate conductive pattern may protrude upwardly from an end of the first portion of the intermediate conductive pattern.

The intermediate conductive pattern may further include a third portion interposed between the first portion and the second portion and covering a sidewall of the lower conductive pattern.

The lower conductive pattern may include a first portion and a second portion that extends downwardly from an end of the first portion.

The device may further include an insulating spacer pattern surrounding an external sidewall of the upper conductive pattern and interposed between the intermediate conductive pattern and the information storage material pattern.

The device may further include a buffer pattern interposed between the external sidewall of the upper conductive pattern and the second portion of the intermediate conductive pattern, and a spacer pattern interposed between the buffer pattern and the information storage material pattern.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE EMBODIMENTS

Figure 1:
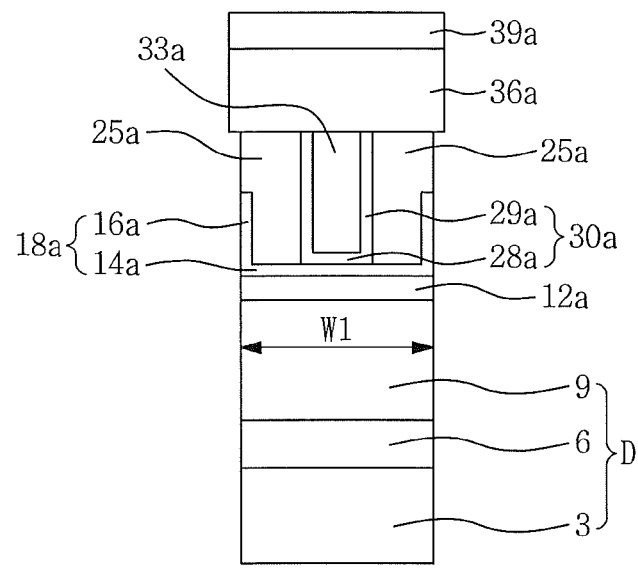
FIG. 1 is a schematic cross-sectional view of a semiconductor device according to some embodiments of the inventive concept.

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys the inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

First, a semiconductor device according to embodiment of the inventive concept will be described with reference to FIGS. 1 through 8.

FIG. 1 is a schematic cross-sectional view of a semiconductor device according to some embodiments of the inventive concept.

Referring to FIG. 1, a switching device D may be provided on a substrate. The switching device D may be a diode. The switching device D may include a first impurity region 3 and a second impurity region 9 that have different conductivity types from each other. A buffer impurity region 6 may be provided between the first impurity region 3 and the second impurity region 9. The buffer impurity region 6 may have the same conductivity type as one of the first impurity region 3 and the second impurity region 9. For example, the first impurity region 3 may be an N-type semiconductor region, the second impurity region 9 may be a P-type semiconductor region, and the buffer impurity region 6 may be an N- or P-type semiconductor region. In some embodiments, the buffer impurity region 6 may have a lower impurity concentration than the first impurity region 3 or the second impurity region 9.

A lower conductive pattern 12a may be provided on the switching device D. The lower conductive pattern 12a may include a metal-semiconductor compound. The lower conductive pattern 12a may be formed of metal silicide, such as CoSi, TiSi, IrSi, PtSi, NiSi, etc. The lower conductive pattern 12a may form an ohmic contact with the second impurity region 9 of the switching device D.

An intermediate conductive pattern 18a may be provided on the lower conductive pattern 12a. The intermediate conductive pattern 18a may be formed of a material such as titanium (Ti), titanium nitride (TiN), etc.

The lower conductive pattern 12a and the intermediate conductive pattern 18a may have the same width W1. An external sidewall of the intermediate conductive pattern 18a may be vertically aligned with a sidewall of the lower conductive pattern 12a.

The intermediate conductive pattern 18a may include a first portion 14a and a second portion 16a. The second portion 16a may protrude upwardly from a part of the first portion 14a. For example, the second portion 16a may protrude upwardly from an end of the first portion 14a. The first portion 14a of the intermediate conductive pattern 18a may be in contact with the lower conductive pattern 12a and may be electrically connected thereto.

An upper conductive pattern 30a may be provided on the intermediate conductive pattern 18a. The upper conductive pattern 30a may be electrically connected to the intermediate conductive pattern 18a. More specifically, the upper conductive pattern 30a may be in contact with the first portion 14a of the intermediate conductive pattern 18a and may be electrically connected thereto. The upper conductive pattern 30a may have a top surface disposed at a higher level (e.g., a longer distance from the lower conductive pattern 12a) than the second portion 16a of the intermediate conductive pattern 18a. Further, the upper conductive pattern 30a may have a bottom surface disposed at a lower level (e.g., a shorter distance from the lower conductive pattern 12a) than the top surface of the second portion 16a of the intermediate conductive pattern 18a. The upper conductive pattern 30a may be in contact with the first portion 14a of the intermediate conductive pattern 18a, and may be spaced apart laterally from the second portion 16a.

The lower conductive pattern 12a and the upper conductive pattern 30a may be formed of different conductive materials from each other, and the intermediate conductive pattern 18a may be formed of a material exhibiting low interfacial resistance characteristics with the lower conductive pattern 12a and the upper conductive pattern 30a. Also, the intermediate conductive pattern 18a may include a material having a lower resistivity than the upper conductive pattern 30a. For example, when the lower conductive pattern 12a is formed of a silicide material, and the upper conductive pattern 30a is formed of TiN or TiSiN, the intermediate conductive pattern 18a may be formed of a conductive material layer including Ti. In some embodiments, the intermediate conductive pattern 18a may be formed of a Ti single layer or a stacked layer of a Ti layer and a TiN layer.

In some embodiments, viewed from a vertical cross-sectional view, the upper conductive pattern 30a may include a first portion 28a and a second portion 29a that protrudes upwardly from an end of the first portion 28a. The first portion 28a of the upper conductive pattern 30a may have a narrower width than the first portion 14a of the intermediate conductive pattern 18a, and may be formed on the first portion 14a of the intermediate conductive pattern 18a. Moreover, the second portion 29a of the upper conductive pattern 30a may have a top surface disposed at a higher level than the second portion 16a of the intermediate conductive pattern 18a.

An insulating pattern 33a may be disposed on the first portion 28a of the upper conductive pattern 30a and may be surrounded by the second portion 29a of the upper conductive pattern 30a. The insulating pattern 33a may be formed of silicon nitride.

An information storage material pattern 36a and an upper electrode 39a may be provided on the upper conductive pattern 30a. The information storage material pattern 36a may be in contact with at least a part of the top surface of the second portion 29a of the upper conductive pattern 30a.

The information storage material pattern 36a may be an element of a resistance memory element that exhibits at least two distinguishable resistance states, e.g., a high resistance and a low resistance, depending on an applied signal. For example, the resistance memory element may include a perovskite memory element, a phase-change memory element, a magnetic memory element, a conductive metal oxide (CMO) memory element, a solid electrolyte memory element, a polymer memory element, or the like. The perovskite memory element may include a colossal magnetoresistive (CMR) material, a high-temperature superconducting (HTSC) material, etc. The solid electrolyte memory element may include a metal ion that is movable in a solid electrolyte, and thus may include a material capable of forming conductive bridging.

A spacer pattern 25a may be provided surrounding an external sidewall of the upper conductive pattern 30a and interposed between the intermediate conductive pattern 18a and the information storage material pattern 36a. The spacer pattern 25a may be formed of an insulating material. For example, the spacer pattern 25a may be formed of silicon nitride.

Figure 2:
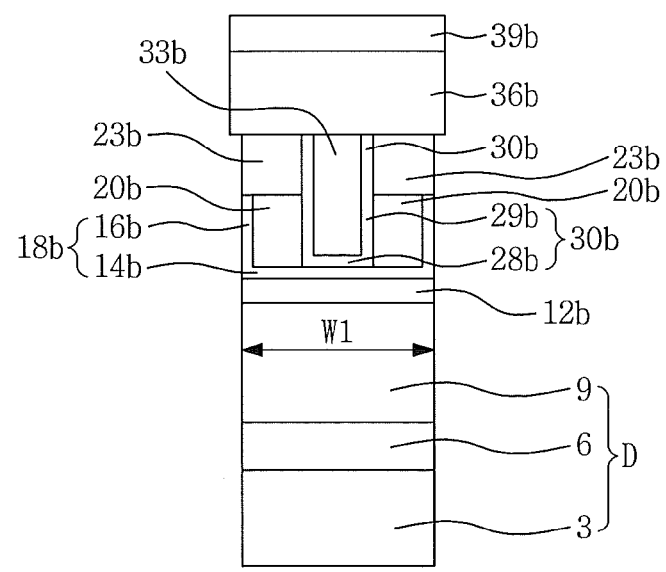
FIG. 2 is a schematic cross-sectional view of a semiconductor device according to other embodiments of the inventive concept.

FIG. 2 is a schematic cross-sectional view of a semiconductor device according to further embodiments of the inventive concept.

Referring to FIG. 2, a lower conductive pattern 12b may be provided on a switching device D such as that described with reference to FIG. 1. The lower conductive pattern 12b may be the same as or similar to the lower conductive pattern 12a described in FIG. 1. As described in FIG. 1, an intermediate conductive pattern 18b may be provided on the lower conductive pattern 12b. The intermediate conductive pattern 18b may include a first portion 14b and a second portion 16b that protrudes upwardly from an end of the first portion 14b.

An upper conductive pattern 30b as described in FIG. 1 may be provided on the intermediate conductive pattern 18b. That is, the upper conductive pattern 30b of FIG. 2 may have substantially the same or similar shape as the upper conductive pattern 30a described in FIG. 1.

The upper conductive pattern 30b may include a first portion 28b and a second portion 29b that protrudes upwardly from a part of the first portion 28b. The first portion 28b of the upper conductive pattern 30b may have a narrower width than the first portion 14b of the intermediate conductive pattern 18b, and may be formed on the first portion 14b of the intermediate conductive pattern 18b. Moreover, the second portion 29b of the upper conductive pattern 30b may have a top surface disposed at a higher level than the second portion 16b of the intermediate conductive pattern 18b.

An insulating pattern 33b may be disposed on the first portion 28b of the upper conductive pattern 30b and may be surrounded by the second portion 29b of the upper conductive pattern 30b. The insulating pattern 33b may be formed of silicon nitride.

An information storage material pattern 36b and an upper electrode 39b may be provided on the upper conductive pattern 30b. The information storage material pattern 36b and the upper electrode 39b may be similar to the information storage material pattern 36a and the upper electrode 39a of FIG. 1.

A buffer pattern 20b interposed between an external sidewall of the upper conductive pattern 30b and the second portion 16b of the intermediate conductive pattern 18b may be provided. A spacer pattern 23b interposed between the buffer pattern 20b and the information storage material pattern 36b may be provided. The spacer pattern 23b may be formed of an insulating material such as silicon nitride.

In some embodiments, the buffer pattern 20b may be formed of a conductive material. The buffer pattern 20b may be formed of a conductive material having an etch selectivity with respect to the intermediate conductive pattern 18b. For example, when the intermediate conductive pattern 18b is formed of a metal layer and/or a metal nitride layer, the buffer pattern 20b may be formed of a conductive material, such as polysilicon. Therefore, the conductive buffer pattern 20b may cause electrical characteristics between the intermediate conductive pattern 18b and the upper conductive pattern 30b to be enhanced. In particular, the electrical resistance between the intermediate conductive pattern 18b and the upper conductive pattern 30b may be reduced because of an increased conductive contact area between the intermediate conductive pattern 18b and the upper conductive pattern 30b.

In other embodiments, the buffer pattern 20b may be formed of an insulating material. For example, the buffer pattern 20b may be formed of an insulating material such as a spin on glass (SOG) layer, a spin on hardmask (SOH) layer, a silicon oxide layer or silicon nitride.

A semiconductor device according to still other embodiments of the inventive concept will be described below with reference to FIG. 3.

Figure 3:
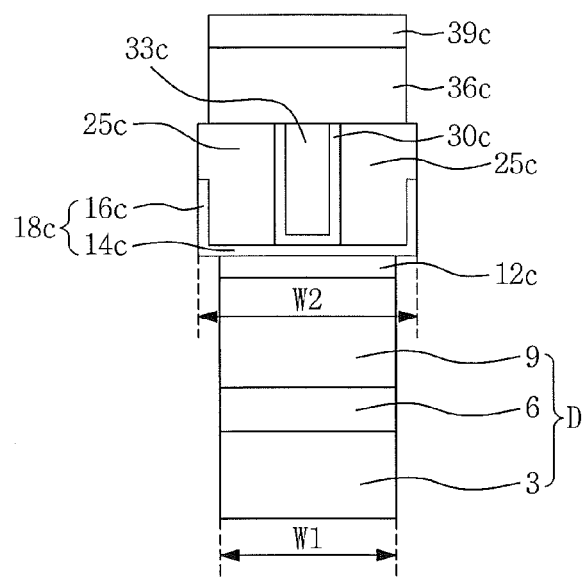
FIG. 3 is a schematic cross-sectional view of a semiconductor device according to still other embodiments of the inventive concept.

Referring to FIG. 3, a switching device D as described in FIG. 1 may be provided. A lower conductive pattern 12c having a first width W1 may be provided on a substrate having the switching device D. The lower conductive pattern 12c may correspond to the lower conductive pattern 12a of FIG. 1.

An intermediate conductive pattern 18c may be provided on the lower conductive pattern 12c. The intermediate conductive pattern 18a may include a first portion 14c and a second portion 16c that protrudes upwardly from an end of the first portion 14c.

The intermediate conductive pattern 18c may be formed to have a greater width than the lower conductive pattern 12c. The lower conductive pattern 12c may be formed to a first width W1, and the first portion 14c of the intermediate conductive pattern 18c may be formed to a second width W2 greater than the first width W1.

An upper conductive pattern 30c and an insulating pattern 33c corresponding to the upper conductive pattern 30a and the insulating pattern 33a described in FIG. 1 may be provided on the intermediate conductive pattern 18c. The upper conductive pattern 30c may have a top surface disposed at a higher level than the second portion 16c of the intermediate conductive pattern 18c. The upper conductive pattern 30c may have a narrower width than the first portion 14c of the intermediate conductive pattern 18c as described in FIG. 1, and may be formed on the first portion 14c of the intermediate conductive pattern 18c. Further, the upper conductive pattern 30c may have a top surface disposed at a higher level than the second portion 16c of the intermediate conductive pattern 18c.

An information storage material pattern 36c and an upper electrode 39c may be provided on the upper conductive pattern 30c. The information storage material pattern 36c and the upper electrode 39c may correspond to the information storage material pattern 36a and the upper electrode 39a of FIG. 1.

An insulating spacer pattern 25c may be provided surrounding an external sidewall of the upper conductive pattern 30c and interposed between the intermediate conductive pattern 18c and the information storage material pattern 36c. The spacer pattern 25c may be formed of an insulating material such as silicon nitride.

Figure 4:
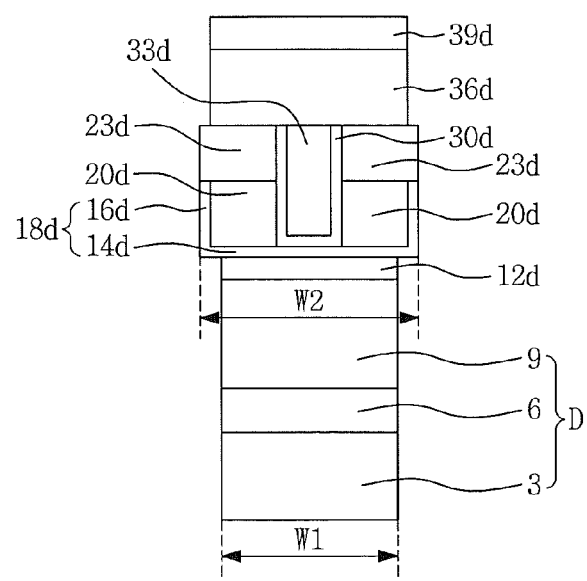
FIG. 4 is a schematic cross-sectional view of a semiconductor device according to yet other embodiments of the inventive concept.

A semiconductor device according to yet other embodiments of the inventive concept will be described with reference to FIG. 4. A switching device D as described in FIG. 1 may be provided. A lower conductive pattern 12d, an intermediate conductive pattern 18d, an upper conductive pattern 30d, an insulating pattern 33d, an information storage material pattern 36d and an upper electrode 39d corresponding to the lower conductive pattern 12c, the intermediate conductive pattern 18c, the upper conductive pattern 30c, the insulating pattern 33c, the information storage material pattern 36c and the upper electrode 39c described in FIG. 3 may be provided on a substrate having the switching device D. The intermediate conductive pattern 18d may include a first portion 14d and a second portion 16d as described in FIG. 3.

A buffer pattern 20d may be interposed between an external sidewall of the upper conductive pattern 30d and the second portion 16d of the intermediate conductive pattern 18d. A spacer pattern 23d may be interposed between the buffer pattern 20d and the information storage material pattern 36d. The spacer pattern 23d may be formed of an insulating material, such as silicon nitride.

In some embodiments, the buffer pattern 20d may be formed of a conductive material. The buffer pattern 20d may be formed of a conductive material having an etch selectivity with respect to the intermediate conductive pattern 18d. For example, when the intermediate conductive pattern 18d is formed of a metal layer and/or a metal nitride layer, the buffer pattern 20d may be formed of a conductive material such as polysilicon.

In other embodiments, the buffer pattern 20d may be formed of an insulating material.

A semiconductor device according to yet other embodiments of the inventive concept will be described with reference to FIG. 5.

Figure 5:
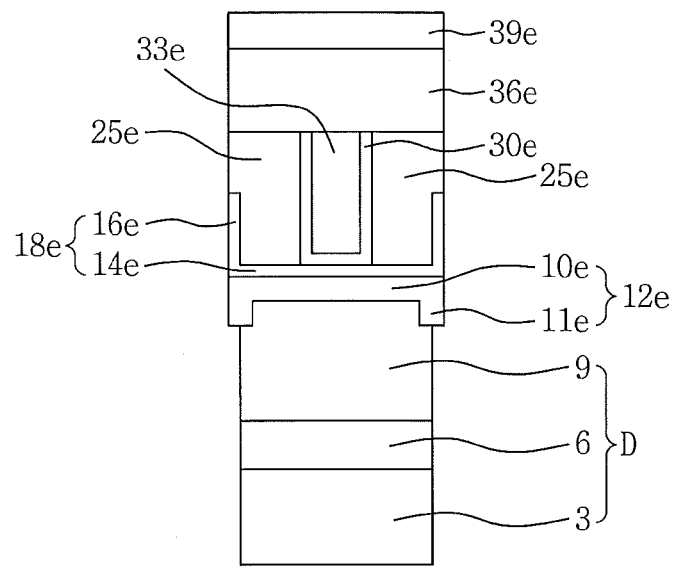
FIG. 5 is a schematic cross-sectional view of a semiconductor device according to yet other embodiments of the inventive concept.

Referring to FIG. 5, a switching device D as described in FIG. 1 may be provided. The switching device D may include a first impurity region 3, a buffer impurity region 6 and a second impurity region 9 as described in FIG. 1.

A lower conductive pattern 12e may be provided on the switching device D. The lower conductive pattern 12e may include a first portion 10e on a top surface of the second impurity region 9 and a second portion 11e that extends downwardly along sidewalls of the second impurity region 9. The lower conductive pattern 12e may be spaced apart from the buffer impurity region 6.

The lower conductive pattern 12e may be formed of metal silicide, such as CoSi, TiSi, IrSi, PtSi, NiSi, etc., and may form an ohmic contact with the second impurity region 9.

An intermediate conductive pattern 18e may be provided on the lower conductive pattern 12e. The intermediate conductive pattern 18e may include a first portion 14e and a second portion 16e that protrudes upwardly from an end of the first portion 14e in a manner similar to the intermediate conductive pattern 18a of FIG. 1.

An upper conductive pattern 30e, an insulating pattern 33e, a spacer pattern 25e, an information storage material pattern 36e and an upper electrode 39e corresponding to upper conductive pattern 30a, the insulating pattern 33a, the spacer pattern 25a, the information storage material pattern 36a and the upper electrode 39a described in FIG. 1 may be provided on the intermediate conductive pattern 18e.

A semiconductor device according to yet other embodiments of the inventive concept will be described below with reference to FIG. 6.

Figure 6:
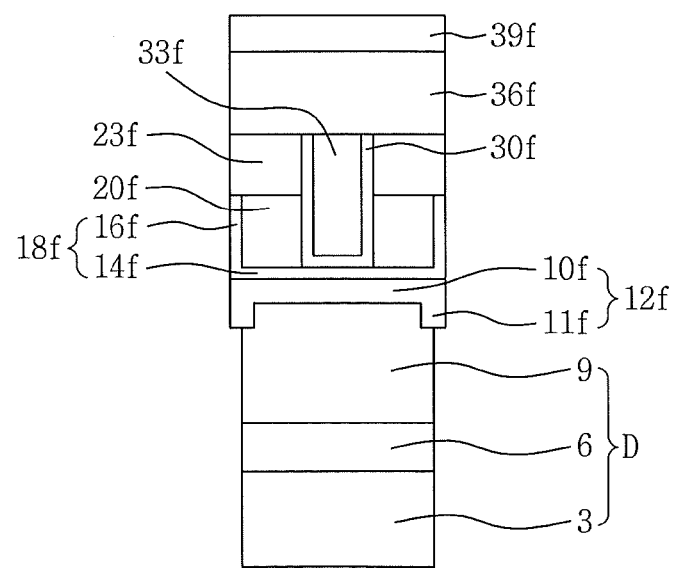
FIG. 6 is a schematic cross-sectional view of a semiconductor device according to yet other embodiments of the inventive concept.

Referring to FIG. 6, a switching device D as described in FIG. 1 may be provided. A lower conductive pattern 12f, an intermediate conductive pattern 18f, an upper conductive pattern 30f, an insulating pattern 33f, an information storage material pattern 36f and an upper electrode 39f corresponding to the lower conductive pattern 12e, the intermediate conductive pattern 18e, the upper conductive pattern 30e, the insulating pattern 33e, the information storage material pattern 36e and the upper electrode 39b described in FIG. 5 may be provided on a substrate having the switching device D.

The lower conductive pattern 12f may include a first portion 10f and a second portion 11f that extends downwardly from an end of the first portion 10f as described in FIG. 5. The intermediate conductive pattern 18f may include a first portion 14f and a second portion 16f as described in FIG. 5.

A buffer pattern 20f may be interposed between an external sidewall of the upper conductive pattern 30f and the second portion 16f of the intermediate conductive pattern 18f. A spacer pattern 23f may be interposed between the buffer pattern 20f and the information storage material pattern 36f. The spacer pattern 23f may be formed of an insulating material, such as silicon nitride.

In some embodiments, the buffer pattern 20f may be formed of a conductive material. The buffer pattern 20f may be formed of a conductive material having an etch selectivity with respect to the intermediate conductive pattern 18f. For example, when the intermediate conductive pattern 18f is formed of a metal layer and/or a metal nitride layer, the buffer pattern 20f may be formed of a conductive material such as polysilicon.

In other embodiments, the buffer pattern 20f may be formed of an insulating material.

A semiconductor device according to yet other embodiments of the inventive concept will be described below with reference to FIG. 7.

Figure 7:
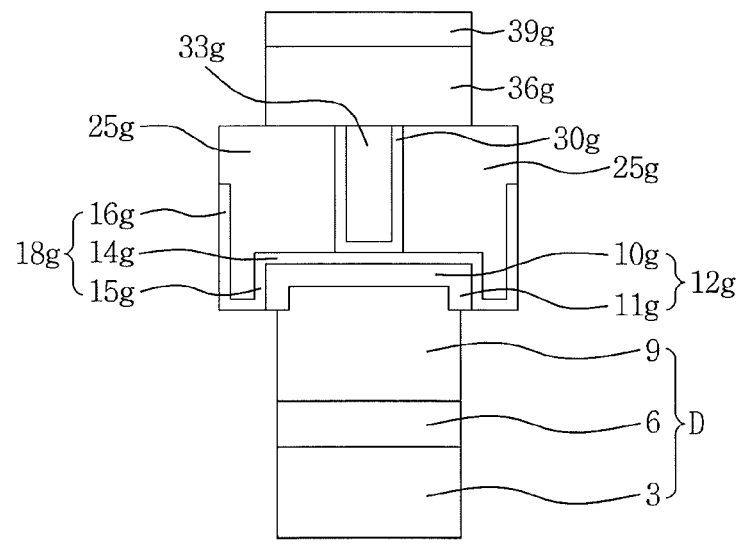
FIG. 7 is a schematic cross-sectional view of a semiconductor device according to yet other embodiments of the inventive concept.

Referring to FIG. 7, a switching device D as described in FIG. 1 may be provided.

A lower conductive pattern 12g may be provided on a substrate having the switching device D as described in FIG. 6. The lower conductive pattern 12g may include a first portion 10g and a second portion 11g that extends downwardly from an end of the first portion 10g.

An intermediate conductive pattern 18g may be provided on the lower conductive pattern 12g. The intermediate conductive pattern 18g may include a first portion 14g covering a top surface of the first portion 10g of the lower conductive pattern 12g, a second portion 15g covering an external sidewall of the second portion 11g of the lower conductive pattern 12g and a third portion 16g connected to the second portion 15g and that protrudes upwardly.

An upper conductive pattern 30g, an insulating pattern 33g, an information storage material pattern 36g and an upper electrode 39g corresponding to the upper conductive pattern 30a, the insulating pattern 33a, the information storage material pattern 36a and the upper electrode 39a described in FIG. 1 may be provided on the intermediate conductive pattern 18g.

A spacer pattern 25g may be provided surrounding an external sidewall of the upper conductive pattern 30g and interposed between the intermediate conductive pattern 18g and the information storage material pattern 36g. The spacer pattern 25g may be formed of an insulating material, such as silicon nitride.

Figure 8:
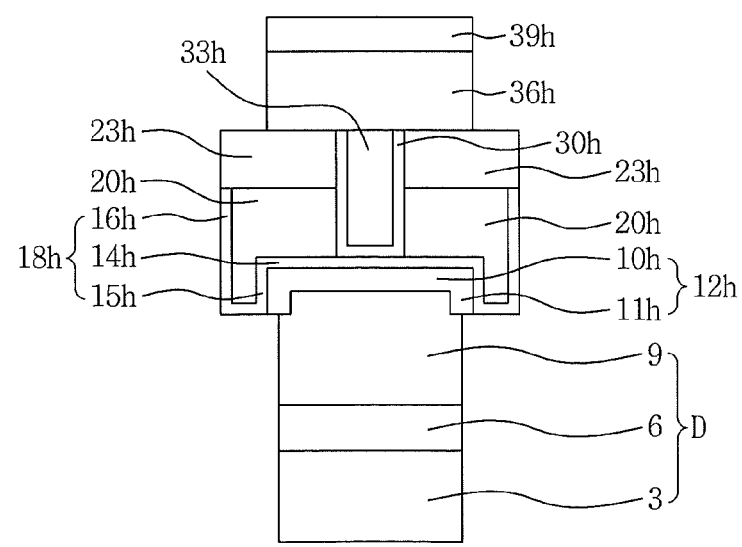
FIG. 8 is a schematic cross-sectional view of a semiconductor device according to yet other embodiments of the inventive concept.

A semiconductor device according to yet other embodiments of the inventive concept will be described below with reference to FIG. 8. Referring to FIG. 8, a switching device D as described in FIG. 1 may be provided. A lower conductive pattern 12h, an intermediate conductive pattern 18h, an upper conductive pattern 30h, an insulating pattern 33h, an information storage material pattern 36h and an upper electrode 39h corresponding to the lower conductive pattern 12g, the intermediate conductive pattern 18g, the upper conductive pattern 30g, the insulating pattern 33g, the information storage material pattern 36g and the upper electrode 39g described in FIG. 7 may be provided on a substrate having the switching device D.

The lower conductive pattern 12h may include a first portion 10h and a second portion 11h that extends downwardly from an end of the first portion 10h as described in FIG. 7. The intermediate conductive pattern 18h may include a first portion 14h on a top surface of the first portion 10h of the lower conductive pattern 12h, a second portion 15h on an external sidewall of the second portion 11h of the lower conductive pattern 12h and a third portion 16h connected to the second portion 15h and that protrudes upwardly.

A buffer pattern 20h may be interposed between an external sidewall of the upper conductive pattern 30h and the third portion 16h of the intermediate conductive pattern 18h. A spacer pattern 23h may be interposed between the buffer pattern 20h and the information storage material pattern 36h. The spacer pattern 23h may be formed of an insulating material, such as silicon nitride.

In some embodiments, the buffer pattern 20h may be formed of a conductive material. The buffer pattern 20h may be formed of a conductive material having an etch selectivity with respect to the intermediate conductive pattern 18h. For example, when the intermediate conductive pattern 18h is formed of a metal layer and/or a metal nitride layer, the buffer pattern 20h may be formed of a conductive material such as polysilicon.

In other embodiments, the buffer pattern 20h may be formed of an insulating material.

Figure 9:
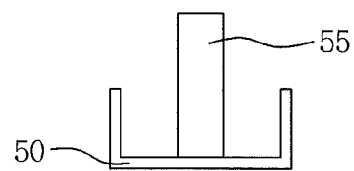
FIG. 9 is a cross-sectional view of a different form of an upper conductive pattern of a semiconductor device according to some embodiments of the inventive concept.

As described above, each of the upper conductive patterns 30a, 30b, 30c, 30d, 30e, 30f and 30g may have a first portion and a second portion that protrudes upwardly from a part of the first portion. However, the inventive concept is not limited thereto, and the upper conductive patterns 30a, 30b, 30c, 30d, 30e, 30f and 30g may be embodied in various forms. For example, as illustrated in FIG. 9, each of the upper conductive patterns 30a, 30b, 30c, 30d, 30e, 30f and 30g may be formed as an upper conductive pattern 55 in the shape of a bar. Further, the upper conductive pattern 55 having the shape of a bar may be electrically connected to a lower conductive pattern 50 and may be disposed at a higher level than the lower conductive pattern 50.

Figure 10:
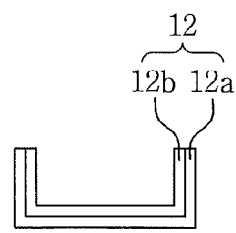
FIG. 10 is a cross-sectional view of a different form of an intermediate conductive pattern of a semiconductor device according to some embodiments of the inventive concept.

Meanwhile, each of the intermediate conductive patterns 18a, 18b, 18c, 18d, 18e, 18f, 18g and 18h described above may be formed as a stacked layer 12 including a first layer 12a and a second layer 12b as illustrated in FIG. 10. Here, the first layer 12a may be provided to surround a bottom surface and a sidewall of the second layer 12b. The first layer 12a may be formed of a metal layer such as a Ti layer, and the second layer 12b may be formed of a nitride layer, such as a TiN layer.

Figure 11:
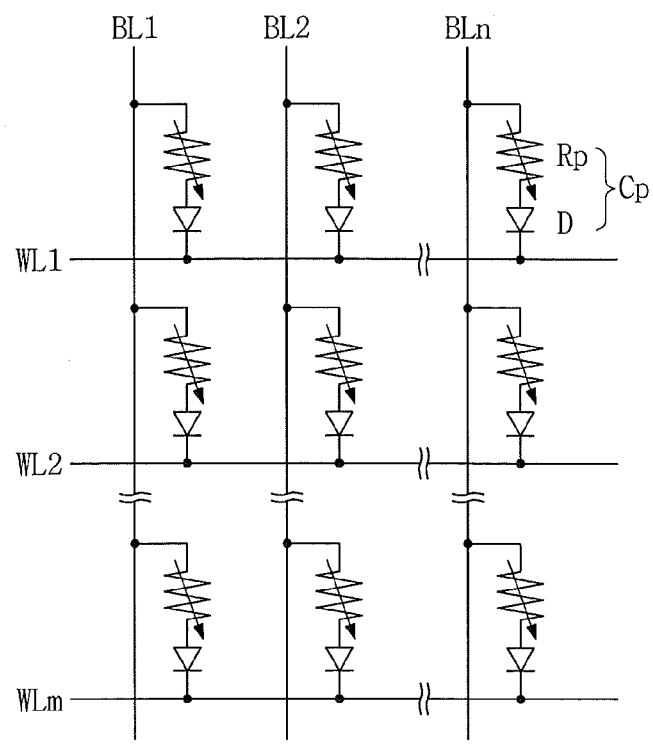
FIG. 11 is an equivalent circuit diagram of a part of a memory cell array region according to some embodiments of the inventive concept.

FIG. 11 is an equivalent circuit diagram of a memory cell employing a diode according to some embodiments of the inventive concept. The memory device may include a plurality of word lines WL1, WL2, . . . , WLm and a plurality of bit lines BL1, BL2, . . . , BLn intersecting in a cell array region, where "m" and "n" may respectively denote positive integers.

Memory cells Cp may be provided at intersections of the word lines WL1, WL2, . . . , WLm and the bit lines BL1, BL2, . . . , BLn. Each of the memory cells Cp may include an information storage element Rp and a diode D electrically connected to each other. One side of the information storage element Rp may be electrically connected to an anode of the diode D and the other side of the information storage element Rp may be electrically connected to one of the bit lines BL1, BL2, . . . , BLn. Also, a cathode of the diode D may be electrically connected to one of the word lines WL1, WL2, . . . , WLm.

Each of the information storage elements Rp may be a resistance memory element that exhibits at least two distinguishable resistance states, e.g., a high resistance and a low resistance, depending on an applied signal. For example, the resistance memory element may include a perovskite memory element, a phase-change memory element, a magnetic memory element, a conductive metal oxide (CMO) memory element, a solid electrolyte memory element, a polymer memory element, or the like. The perovskite memory element may include a colossal magnetoresistive (CMR) material, a high-temperature superconducting (HTSC) material, etc. The solid electrolyte memory element may include a metal ion that is movable in a solid electrolyte, and thus may include a material capable of forming conductive bridging.

Embodiments of the inventive concept in which a phase-change memory element is employed as an information storage element Rp will be described below. Therefore, the following descriptions may be applied to a semiconductor device that employs any of the above-described memory elements.

Figure 12:
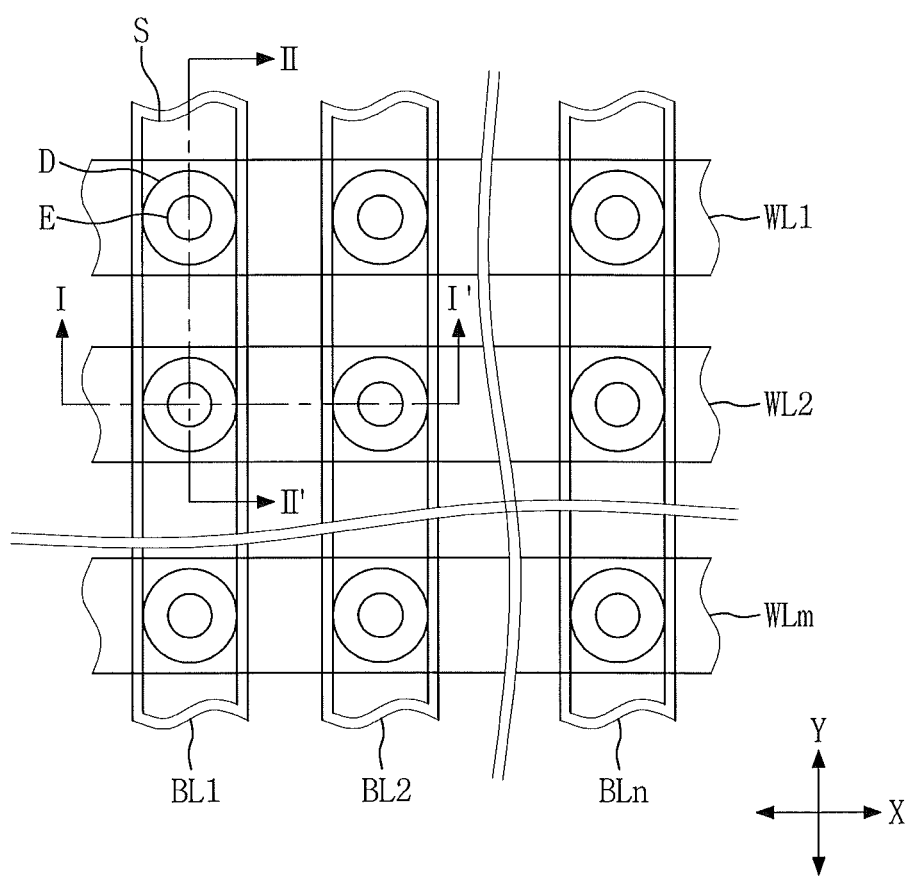
FIG. 12 is a plan view corresponding to the equivalent circuit diagram of FIG. 11.

FIG. 12 is a plan view of a semiconductor device according to embodiments of the inventive concept. FIGS. 13A through 18B are cross-sectional views of a semiconductor device according to some embodiments of the inventive concept. FIGS. 19A through 20B are cross-sectional views of a semiconductor device according to other embodiments of the inventive concept. FIGS. 21A through 22B are cross-sectional views of a semiconductor device according to still other embodiments of the inventive concept. FIGS. 23A through 25B are cross-sectional views of a semiconductor device according to yet other embodiments of the inventive concept, and FIGS. 26A through 27B are cross-sectional views of a semiconductor device according to yet other embodiments of the inventive concept.

In FIGS. 13A through 27B, FIGS. 13A, 14A, 15A, 16A, 17A, 18A, 19A, 20A, 21A, 22A, 23A, 24A, 25A, 26A and 27A are cross-sectional views taken along line I-I' of FIG. 12, and FIGS. 13B, 14B, 15B, 16B, 17B, 18B, 19B, 20B, 21B, 22B, 23B, 24B, 25B, 26B and 27B are cross-sectional views taken along line II-II' of FIG. 12.

First, methods of fabricating a semiconductor device according to some embodiments and a semiconductor device fabricated using the same will be described below with reference to FIGS. 12, and 13A through 18B.

Figure 13A:
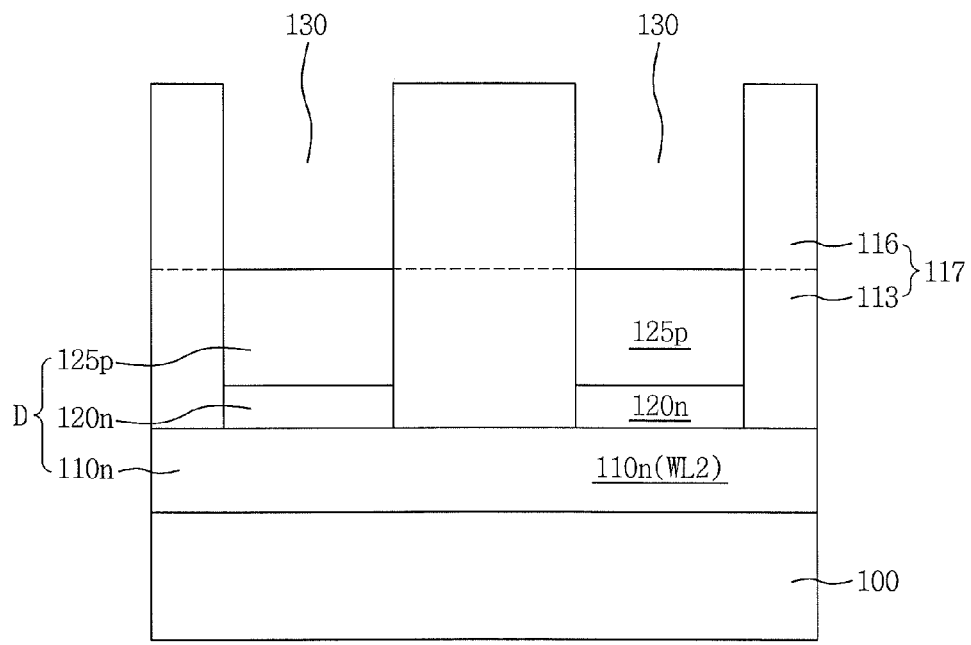
FIGS. 13A through 18B are cross-sectional views illustrating a method of fabricating a semiconductor device according to some embodiments of the inventive concept.
Figure 13B:
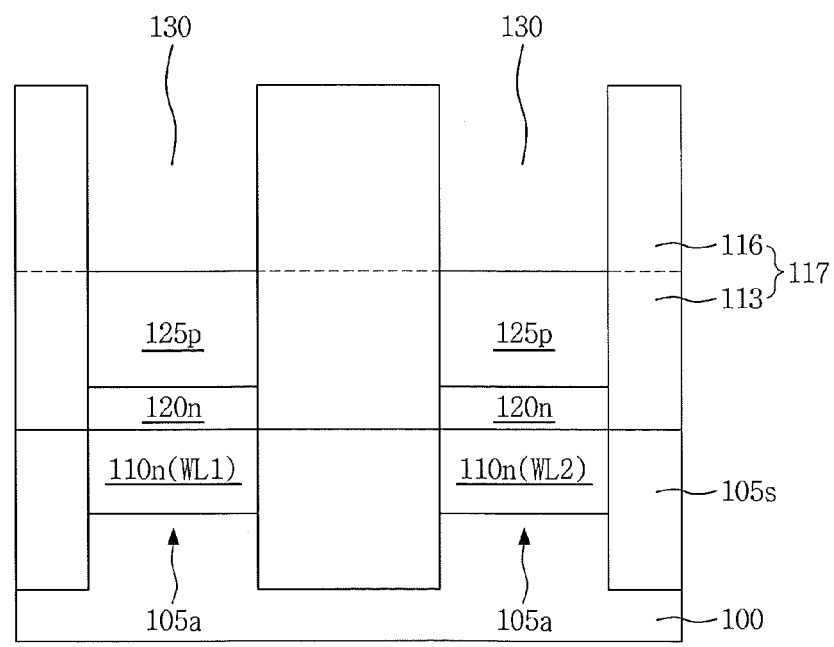

Referring to FIGS. 12, 13A and 13B, a semiconductor substrate 100 may be provided. The semiconductor substrate 100 may be a silicon substrate. Isolation regions 105s defining a plurality of active regions 105a may be formed in the semiconductor substrate 100. The isolation region 105s may be formed using a shallow trench isolation technique. The active regions 105a may be defined to be substantially parallel to each other.

In another embodiment, a silicon on insulator (SOI) substrate having a single crystalline semiconductor body layer may be used as the semiconductor substrate 100. In such a case, the process for forming the isolation region may be replaced by a process for patterning the single crystalline semiconductor body layer to form single crystalline semiconductor body patterns, and filling between the single crystalline semiconductor body patterns with an insulating material layer. Further, the single crystalline semiconductor body patterns may correspond to the active regions 105a.

Impurity ions having a different conductivity type from the semiconductor substrate 100 may be implanted into the active regions 105a to form first impurity regions 110n of a first conductivity type. Therefore, the isolation region 105s may function to electrically isolate the first impurity regions 110n. The first impurity regions 110n may correspond to the word lines WL1, WL2, ..., WLm of FIG. 12.

An interlayer insulating layer 117 may be formed on the entire surface of the semiconductor substrate having the first impurity regions 110n. The interlayer insulating layer 117 may include a silicon oxide layer. The interlayer insulating layer 117 may be patterned to form a plurality of holes 130 exposing predetermined regions of the first impurity regions 110n.

Viewed from a plan view of FIG. 12, the holes 130 may be formed in the shape of a circle. However, the shapes of the holes 130 are not limited hereto. For example, viewed from a plan view, the holes 130 may be formed in various shapes, including a quadrangle or an oval.

Semiconductor patterns partially filling the holes 130 may be formed. For example, the semiconductor patterns may be formed using an epitaxial growth technique. A buffer impurity region 120n and a second impurity region 125p, which are sequentially stacked in each of the semiconductor patterns, may be formed. For example, the first impurity ions may be implanted into the semiconductor patterns to form the buffer impurity region 120n of a first conductivity type and the second impurity region 125p of a second conductivity type different from the first conductivity type. The buffer impurity region 120n may have a lower impurity concentration than the first impurity regions 110n. Therefore, the first impurity regions 110n, the buffer impurity region 120n and the second impurity region 125p may constitute a cell diode D. The first conductivity type may be N-type, and the second conductivity type may be P-type in some embodiments.

In some embodiments, the interlayer insulating layer 117 may be formed of a first interlayer insulating layer 113 and a second interlayer insulating layer 116, which are sequentially stacked. The first interlayer insulating layer 113 may be formed on the semiconductor substrate having the first impurity regions 110n, and semiconductor patterns penetrating the first interlayer insulating layer 113 and connected to the first impurity regions 110n may be formed. Moreover, the intermediate impurity region 120n and the second impurity region 125p may be formed in the semiconductor patterns. Afterwards, holes 130 exposing the second impurity region 125p may be formed.

Figure 14A:
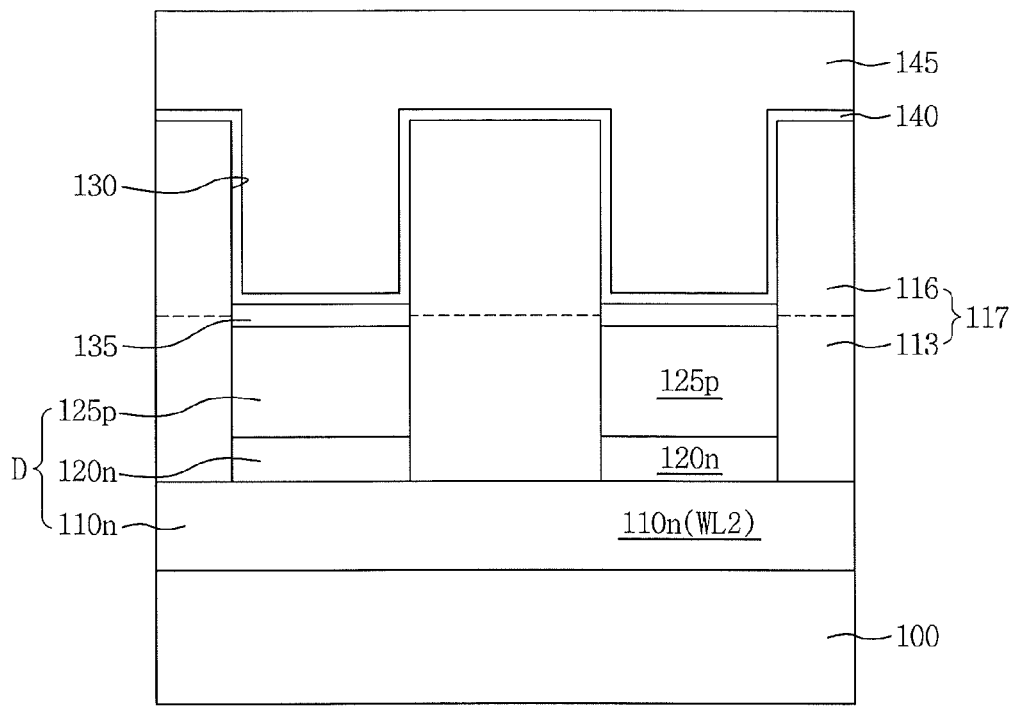
Figure 14B:
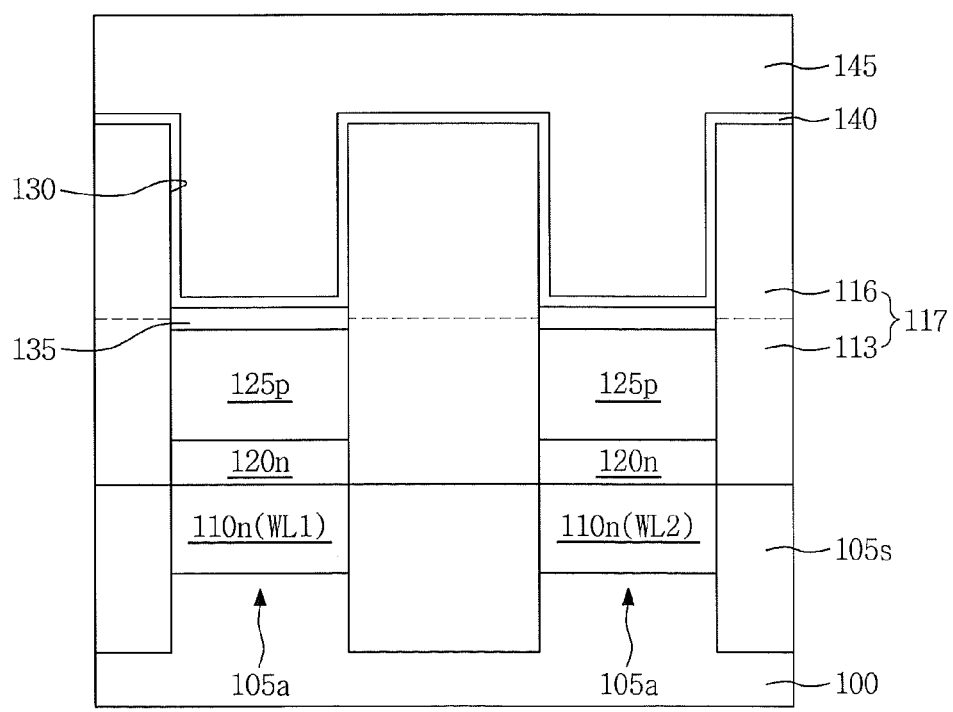

Referring to FIGS. 12, 14A and 14B, lower conductive patterns 135 that are electrically connected to the diodes D may be formed. Forming each of the lower conductive patterns 135 may include forming a metal layer on the substrate having the diodes D, performing a silicide annealing process to react the second impurity region 125p with the metal layer, forming a metal-semiconductor compound and removing a metal layer that does not react. Therefore, the lower conductive patterns 135 may be formed of a metal-semiconductor compound, including a metal silicide such as CoSi, TiSi, IrSi, PtSi, NiSi, etc.

An intermediate metal layer 140 may be formed on the entire surface of the substrate having the lower conductive patterns 135. A buffer layer 145 filling remaining regions of the holes 130 may be foamed on the intermediate metal layer 140.

In some embodiments, the buffer layer 145 may be formed of a conductive material having an etch selectivity with respect to the intermediate metal layer 140. For example, when the intermediate metal layer 140 is formed of titanium (Ti) and/or titanium nitride (TiN), the buffer layer 145 may be formed of polysilicon.

In other embodiments, the buffer layer 145 may be formed of an insulating material using a spin coating method. For example, the buffer layer 145 may be formed of a spin on glass (SOG) layer, or a spin on hardmask (SOH) layer containing carbon. Alternatively, the buffer layer 145 may be formed of silicon oxide or silicon nitride using a deposition method.

Figure 15A:
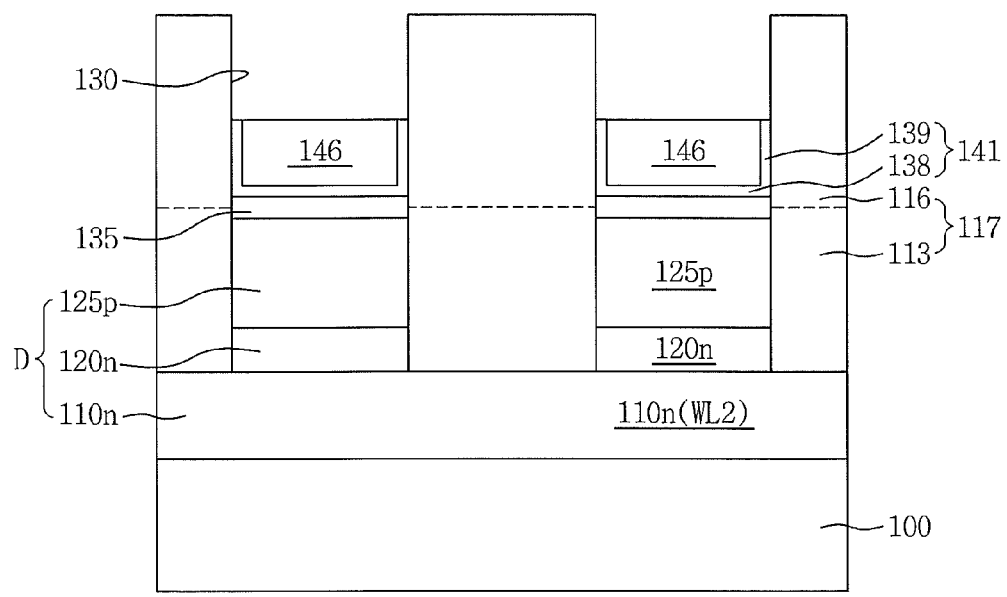
Figure 15B:
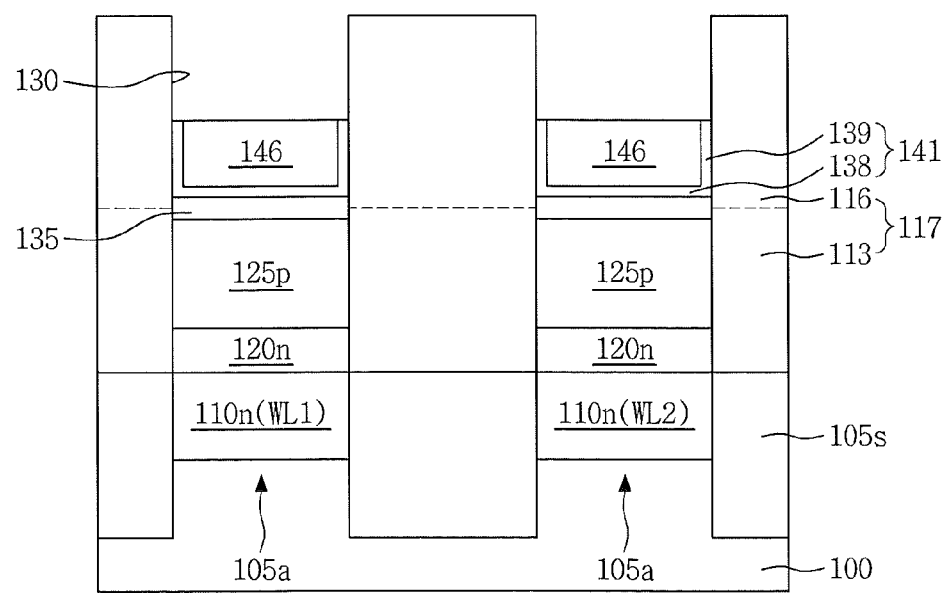

Referring to FIGS. 12, 15A and 15B, the buffer layer 145 may be etched to form buffer masks 146 that partially fill the holes 130. Then, the portion of the intermediate metal layer 140 exposed as a result of forming the buffer masks 146 may be removed by etching. As a result, intermediate conductive patterns 141 surrounding sidewalls and bottom surfaces of the buffer masks 146 may be formed. Each of the intermediate conductive patterns 141 may include a first portion 138 disposed between the lower conductive pattern 135 and the buffer mask 146 and a second portion 139 covering a sidewall of the buffer mask 146. That is, each of the intermediate conductive patterns 141 may include the first portion 138 and the second portion 139 that protrudes upwardly from a part, i.e., an end of the first portion 138.

Figure 16A:
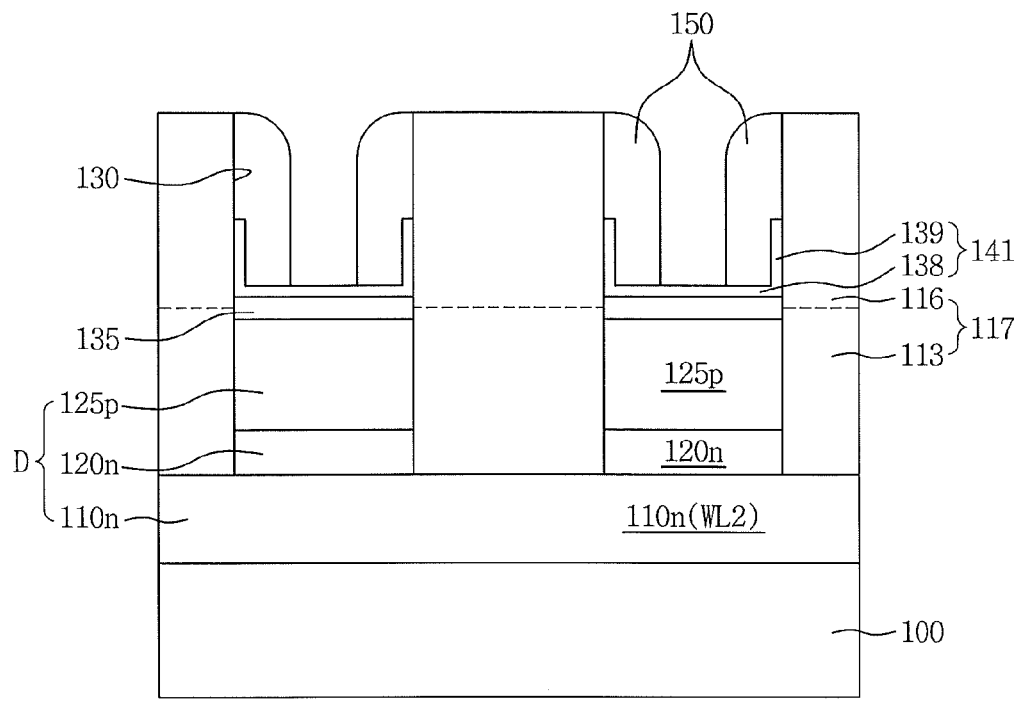
Figure 16B:
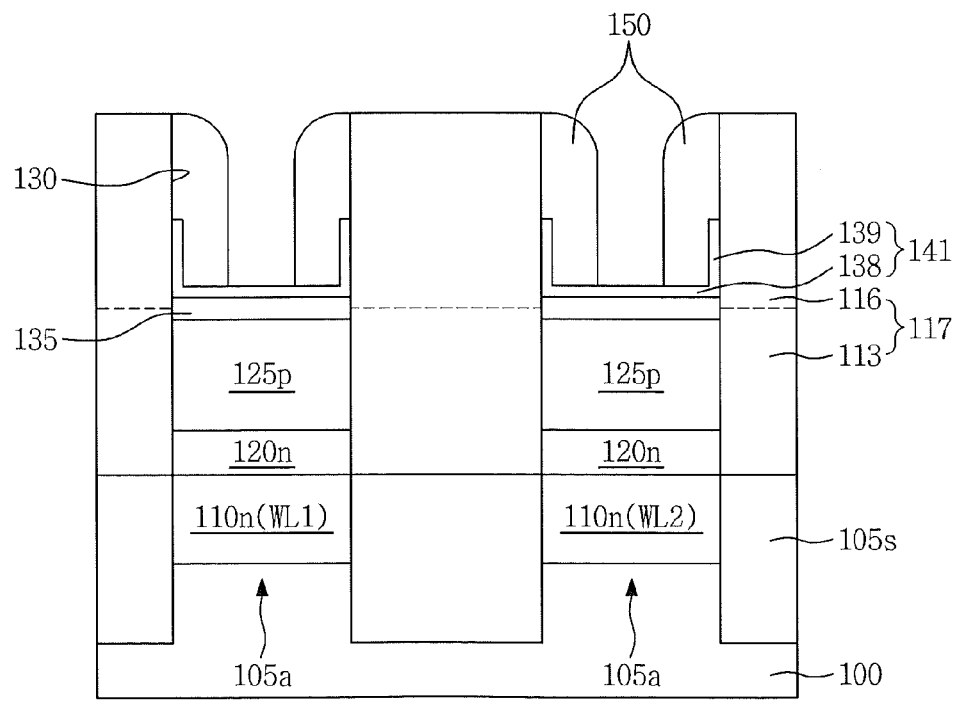

Referring to FIGS. 12, 16A and 16B, the buffer masks 146 may be removed. Afterwards, a spacer layer may be formed on the entire surface of the substrate from which the buffer masks 146 are removed, and the spacer layer may be anisotropically etched to form spacer patterns 150. The spacer layer may be formed of a material having an etch selectivity with respect to the interlayer insulating layer 117. For example, when the interlayer insulating layer 117 is formed of silicon oxide, the spacer layer may be formed of silicon nitride.

The spacer patterns 150 may cover the intermediate conductive patterns 141 and the second portions 139, and may partially cover the first portions 138. Further, the spacer patterns 150 may cover sidewalls of the holes disposed on the intermediate conductive patterns 141. The spacer patterns 150 may expose center portions of the first portions 138 of the intermediate conductive patterns 141.

Figure 17A:
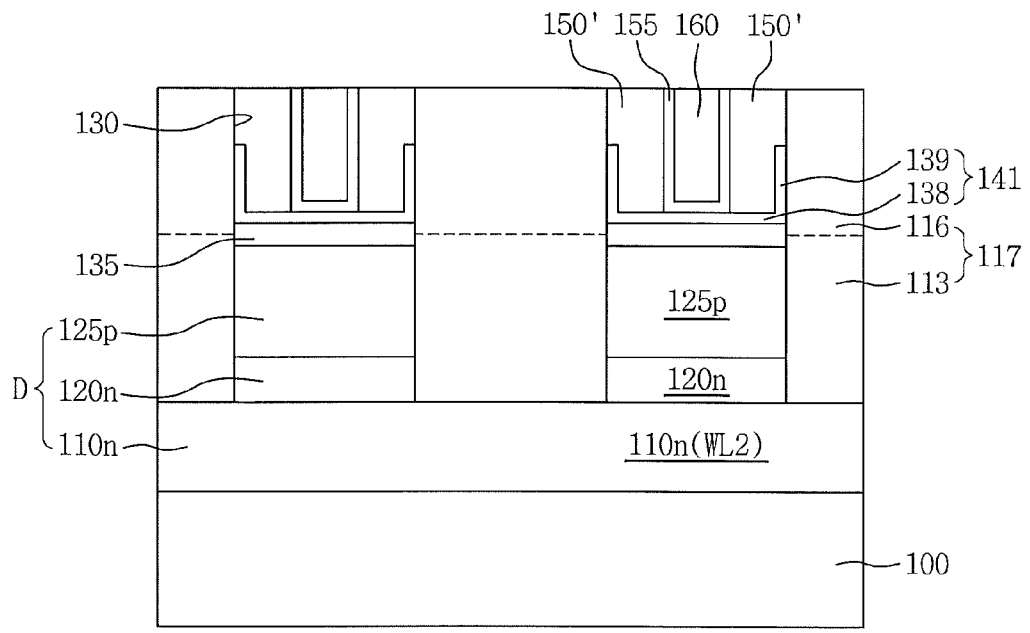
Figure 17B:
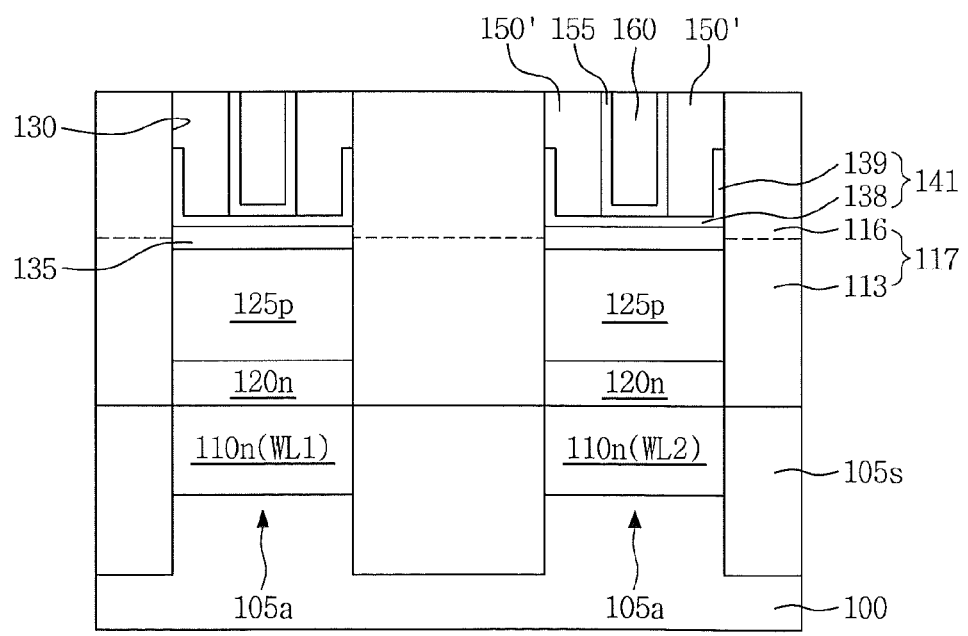

Referring to FIGS. 12, 17A and 17B, an upper conductive layer may be formed on the semiconductor substrate having the spacer patterns 150, and an insulating layer filling remaining portions of the holes 130 may be formed on the upper conductive layer. Then, a planarization process may be performed. As a result, the upper conductive layer may be formed as upper conductive patterns 155, and the insulating layer may be formed as insulating patterns 160.

The planarization process may be performed such that the thickness of the interlayer insulating layer 117 is partially reduced. The planarization process may be a chemical mechanical polishing (CMP) process. The planarization may cause the spacer pattern to be formed as a spacer pattern 150' whose height is reduced.

Therefore, the lower conductive pattern 135, the intermediate conductive pattern 141, the upper conductive pattern 155, the insulating pattern 160 and the spacer pattern 150' corresponding to the lower conductive pattern 12a, the intermediate conductive pattern 18a, the upper conductive pattern 30a, the insulating pattern 33a, and the spacer pattern 25a described in FIG. 1 may be formed. Since the lower conductive pattern 135, the intermediate conductive pattern 141, the upper conductive pattern 155, the insulating pattern 160 and the spacer pattern 150' may be understood from FIG. 1, further descriptions thereof will be omitted.

Figure 18A:
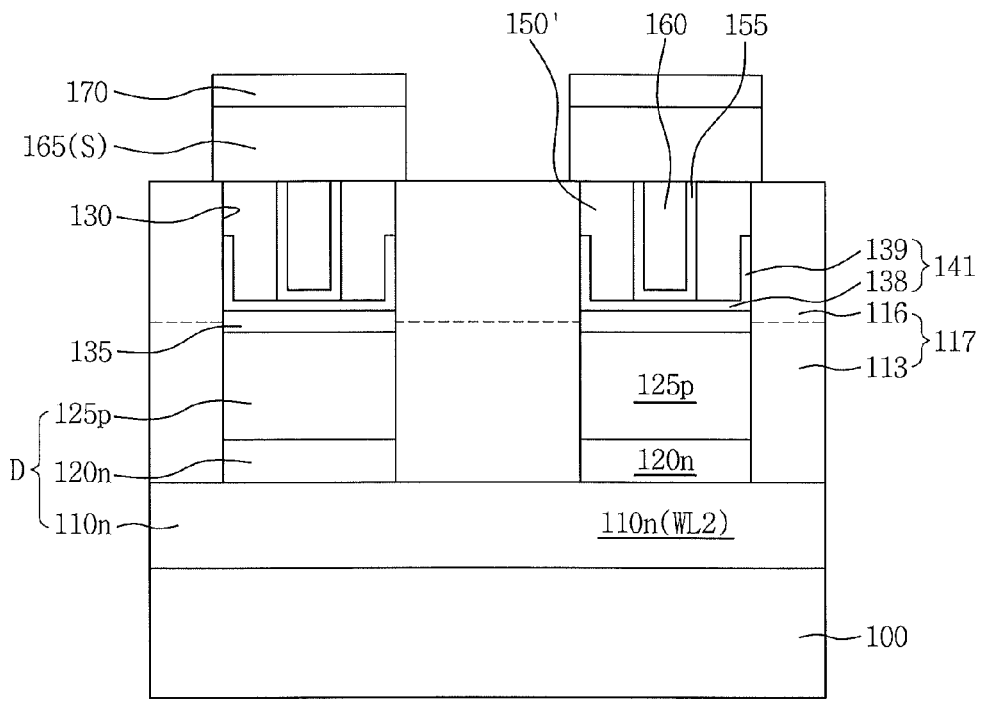
Figure 18B:
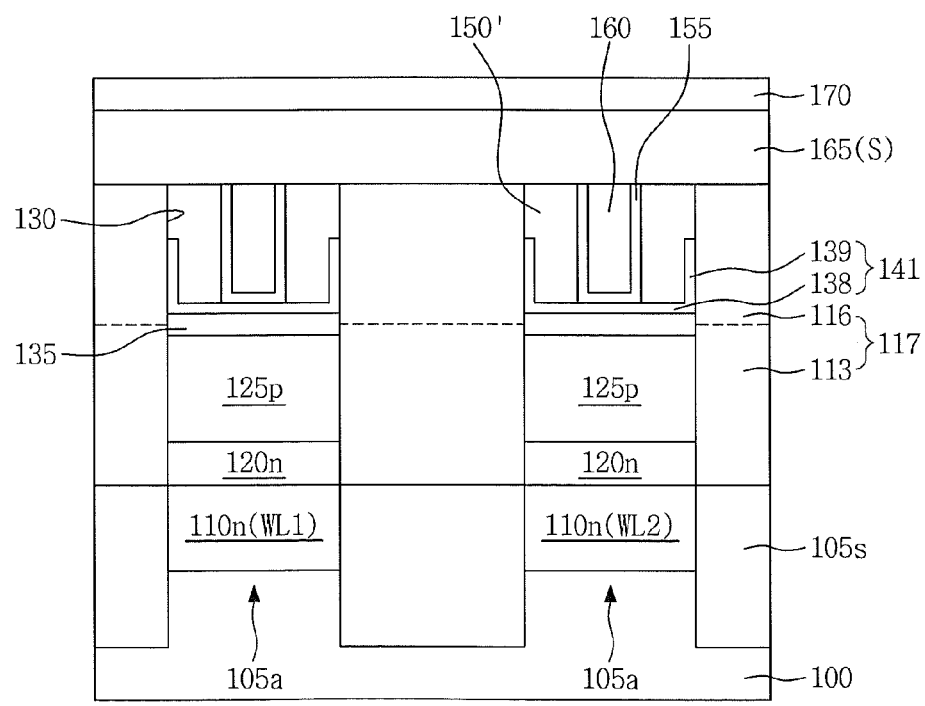

Referring to FIGS. 12, 18A and 18B, information storage material patterns 165(S) and upper electrodes 170, which are sequentially stacked, may be formed on the substrate having the upper conductive patterns 155. The information storage material patterns 165(S) may include a phase-change material layer whose resistance to a flowing current varies depending on a phase. The phase-change material layer may be a material layer including at least one of Te, Se, Ge, Sb, Bi, Pb, Sn, Ag, As, S, Si, P, O and C. For example, the phase-change material layer may be used for a phase-change memory cell in addition to a chalcogenide layer, such as a GST layer. The upper electrodes 170 may be formed of a layer selected from the group consisting of a Ti layer, a Si layer, a Ta layer, a Mo layer, a W layer, a Ru layer, a TiW layer, a TiN layer, a TiON layer, a TiAlN layer, a TiAlON layer, a TiSiN layer, a TiBN layer, a WN layer, a WON layer, a WSiN layer, a WBN layer, a WCN layer, a TaN layer, a TaON layer, a TaAlN layer, a TaSiN layer, a TaCN layer, a MoN layer, a MoSiN layer, a MoAlN layer, a NbN layer, a ZrSiN layer, a ZrAlN layer, a TiC layer, a TiCN layer, a TiSi layer, a TaSi layer, a CoSi layer, a NiSi layer, a conductive carbon group layer, a Cu group layer, and combinations thereof. The upper electrodes 170 may correspond to bit lines BL1, BL2, . . . , BLn of FIG. 12.

In some embodiments, the information storage material patterns 165 may be formed in the shape of lines spaced apart from each other. For example, viewed from a plan view, the information storage patterns 165 may be formed in the shape of lines having a second orientation Y crossing the word lines WL1, WL2, . . . , WLm of a first orientation X. The information storage patterns 165 may correspond to a mark "S" of FIG. 12.

In some embodiments, the information storage patterns 165 may be spaced apart from each other in an island type.

Viewed from a plan view, the information storage patterns 165 disposed at intersections between the first impurity regions 110n corresponding to the word lines WL1, WL2, . . . , WLm and the upper electrodes 170 corresponding to the bit lines BL1, BL2, . . . , BLn may be defined as information storage elements Rp.

The upper conductive patterns 155 disposed below the information storage patterns 165 may be defined as lower electrodes E.

Next, methods of fabricating a semiconductor device according to other embodiments and a semiconductor device fabricated using the same will be described below with reference to FIGS. 19A through 22B.

Figure 19A:
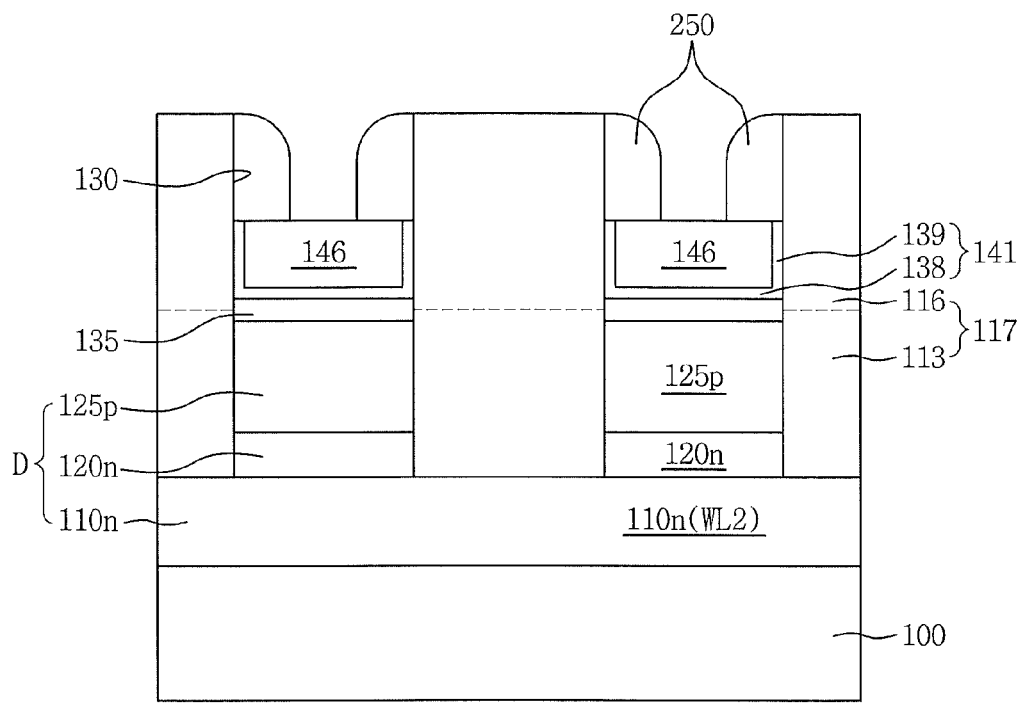
FIGS. 19A through 20B are cross-sectional views illustrating a method of fabricating a semiconductor device according to other embodiments of the inventive concept.
Figure 19B:
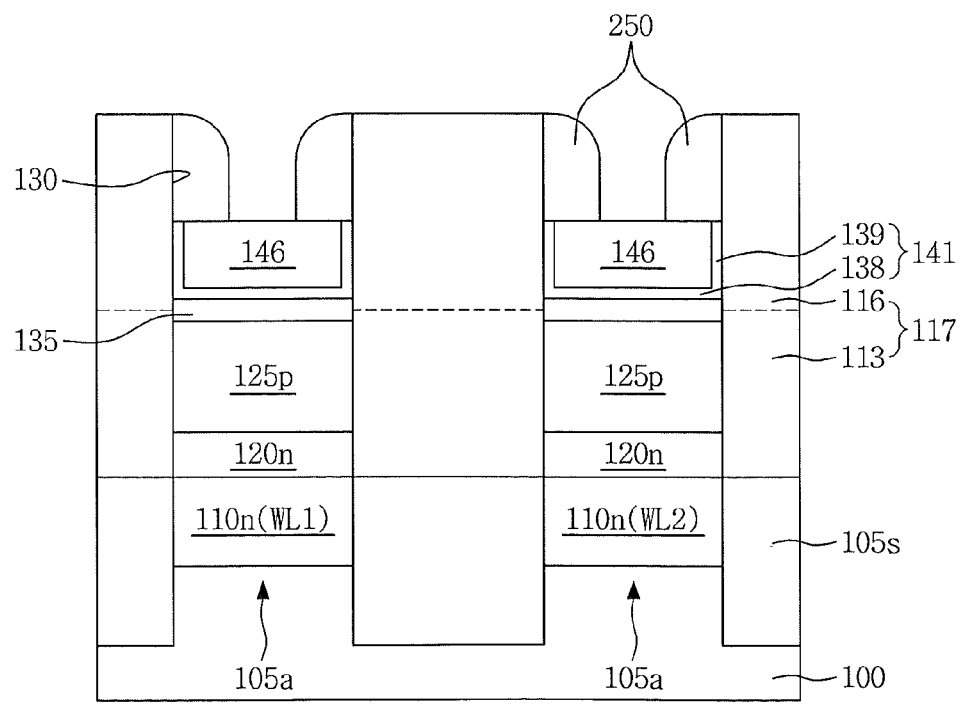

Referring to FIGS. 12, 19A and 19B, similar steps as described with reference to FIGS. 10A through 15B may be performed, and a substrate on which the buffer masks 146 and the intermediate conductive patterns 141 are formed may be provided. Spacer patterns 250 may be formed on sidewalls of the holes 130 filled with the buffer masks 146. The spacer patterns may be formed of an insulating material, such as silicon nitride. Forming the spacer patterns 250 may include forming a spacer layer on the substrate having the buffer masks 146, and anisotropically etching the spacer layer. While the spacer layer is anisotropically etched to form the spacer patterns 250, the buffer masks 146 may reduce damage to the intermediate conductive patterns 141.

Figure 20A:
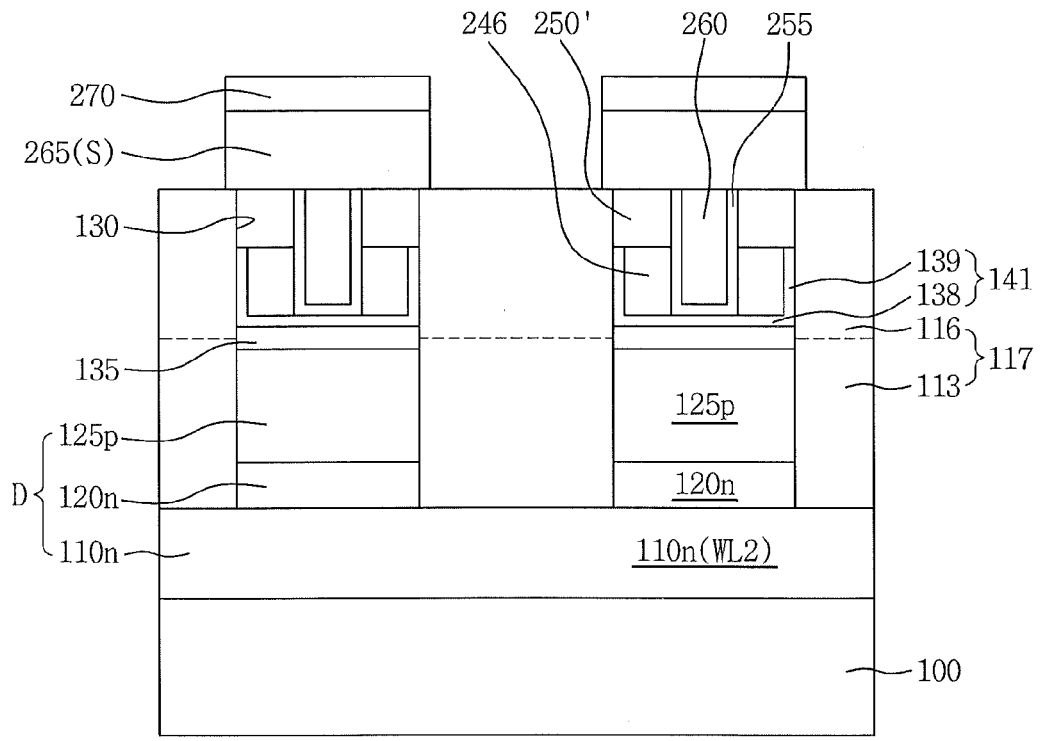
Figure 20B:
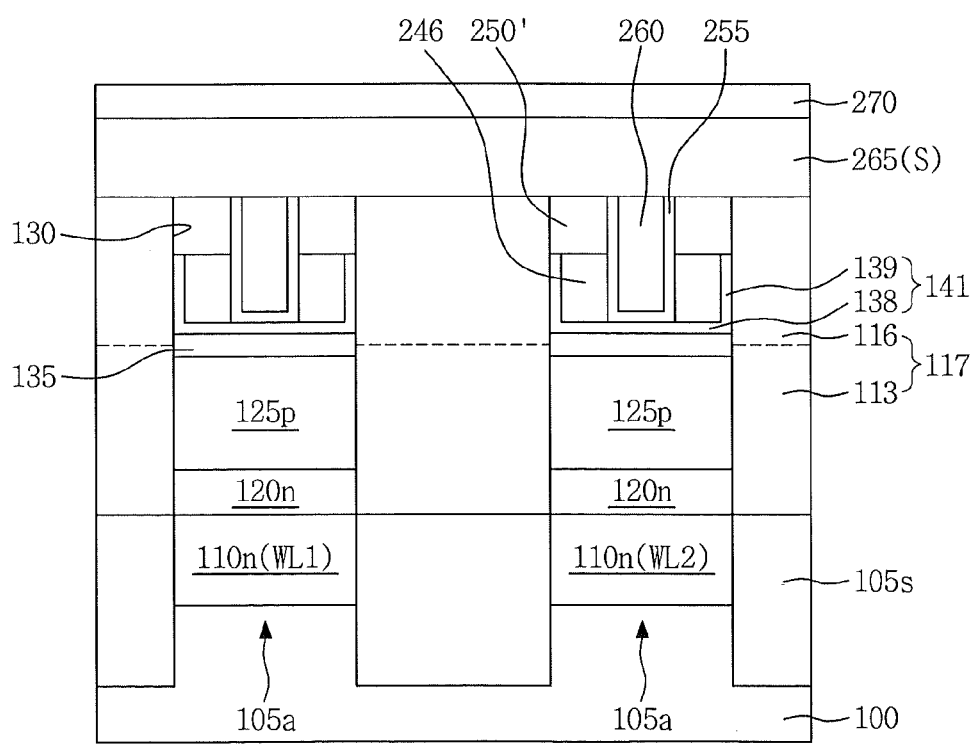

Referring to FIGS. 12, 20A and 20B, the buffer masks 146 may be etched using the spacer patterns 250 and the interlayer insulating layer 117 as etch masks to form buffer patterns 246.

Then, an upper conductive layer may be formed on the substrate having the spacer patterns 250 and the buffer patterns 246, and an insulating layer filling remaining portions of the holes 130 may be formed on the upper conductive layer. Afterwards, a planarization process may be performed. As a result, the upper conductive layer may be formed as upper conductive patterns 255, and the insulating layer may be formed as insulating patterns 260. The planarization process may be performed such that the thickness of the interlayer insulating layer 117 may be partially reduced. The planarization may enable the spacer pattern to be formed as a spacer pattern 250' whose height is reduced.

Therefore, the lower conductive pattern 135, the intermediate conductive pattern 141, the upper conductive pattern 255, the insulating pattern 260, the buffer patterns 246 and the spacer pattern 250' corresponding to the lower conductive pattern 12b, the intermediate conductive pattern 18b, the upper conductive pattern 30b, the insulating pattern 33b, the buffer patterns 20b and the spacer pattern 25a described in FIG. 2 may be formed. Therefore, since the lower conductive pattern 135, the intermediate conductive pattern 141, the upper conductive pattern 255, the insulating pattern 260, the buffer patterns 246 and the spacer pattern 250' may be understood from FIG. 2, further description thereof will be omitted.

Afterwards, as illustrated in FIGS. 18A and 18B, information storage material patterns 265(S) and upper electrodes 270, which are sequentially stacked, may be formed on the substrate having the upper conductive patterns 255.

Next, a method of fabricating a semiconductor device according to still other embodiments of the inventive concept and a semiconductor device fabricated using the same will be described below with reference to FIGS. 21A through 22B.

Figure 21A:
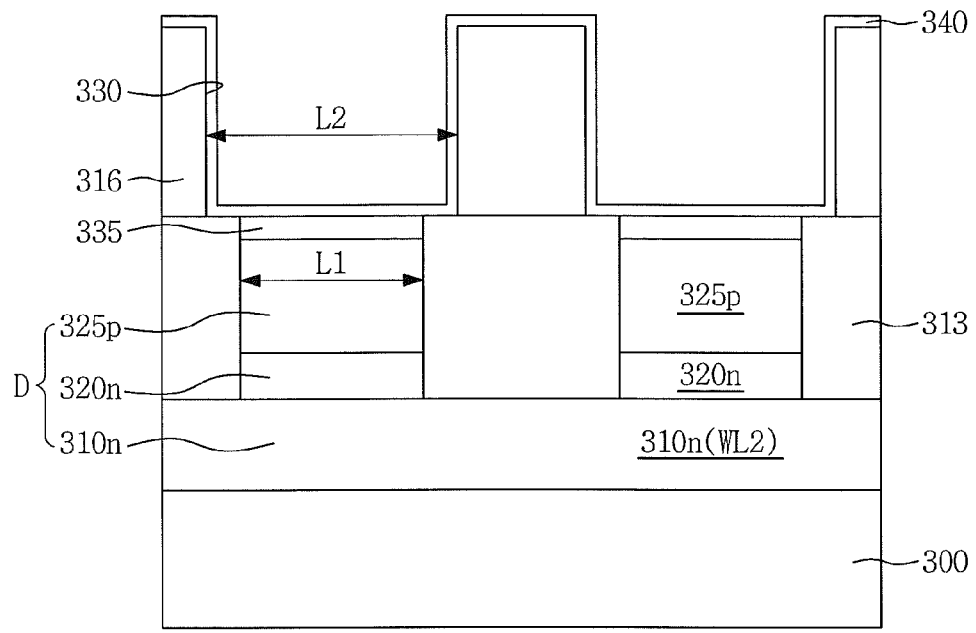
FIGS. 21A through 22B are cross-sectional views illustrating a method of fabricating a semiconductor device according to still other embodiments of the inventive concept.
Figure 21B:
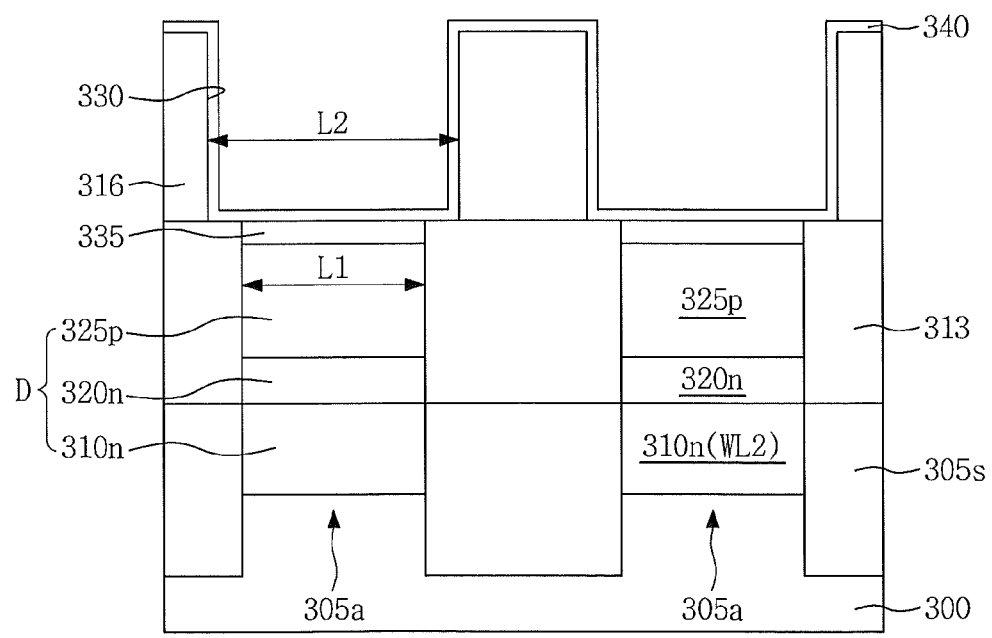

Referring to FIGS. 12, 21A and 21B, as described in FIGS. 13A and 13B, isolation regions 305s defining a plurality of active regions 305a may be formed in a predetermined region of a semiconductor substrate 300.

Impurity ions having a different conductivity type from the semiconductor substrate 100 may be implanted into the active regions 305a to form first impurity regions 310n of a first conductivity type. The first impurity regions 310n may correspond to the word lines WL1, WL2, . . . , WLm of FIG. 12.

A first interlayer insulating layer 313 may be formed on the semiconductor substrate having the first impurity regions 310n. The first interlayer insulating layer 313 may include a silicon oxide layer. The first interlayer insulating layer 313 may be patterned to form a plurality of holes 130 exposing predetermined regions of the first impurity regions 110n. Viewed from a plan view, the holes may be formed in the shape of a circle. However, the shapes of the holes are not limited thereto. For example, viewed from a plan view, the holes may be formed in various shapes, including a quadrangle or an oval.

Semiconductor patterns, each of which has a first width L1, may be formed, and a buffer impurity region 320n and a second impurity region 325p, which are sequentially stacked in each of the semiconductor patterns, may be formed. The first impurity region 310n, the buffer impurity region 320n and the second impurity region 325p may correspond to the first impurity region 110n, the buffer impurity region 120n and the second impurity region 125p illustrated in FIGS. 13A and 13B, and may constitute a cell diode D.

A second interlayer insulating layer 316 having holes 330, each of which has a second width L2, may be formed on the first, interlayer insulating layer 313. The second width L2 may be greater than the first width L1.

As illustrated in FIGS. 14A and 14B, a silicide process may be performed to form lower conductive patterns 335 on the second impurity region 325p exposed by the holes 330 of the second interlayer insulating layer 316, and an intermediate metal layer 340 may be formed on the substrate having the lower conductive patterns 335.

Figure 22A:
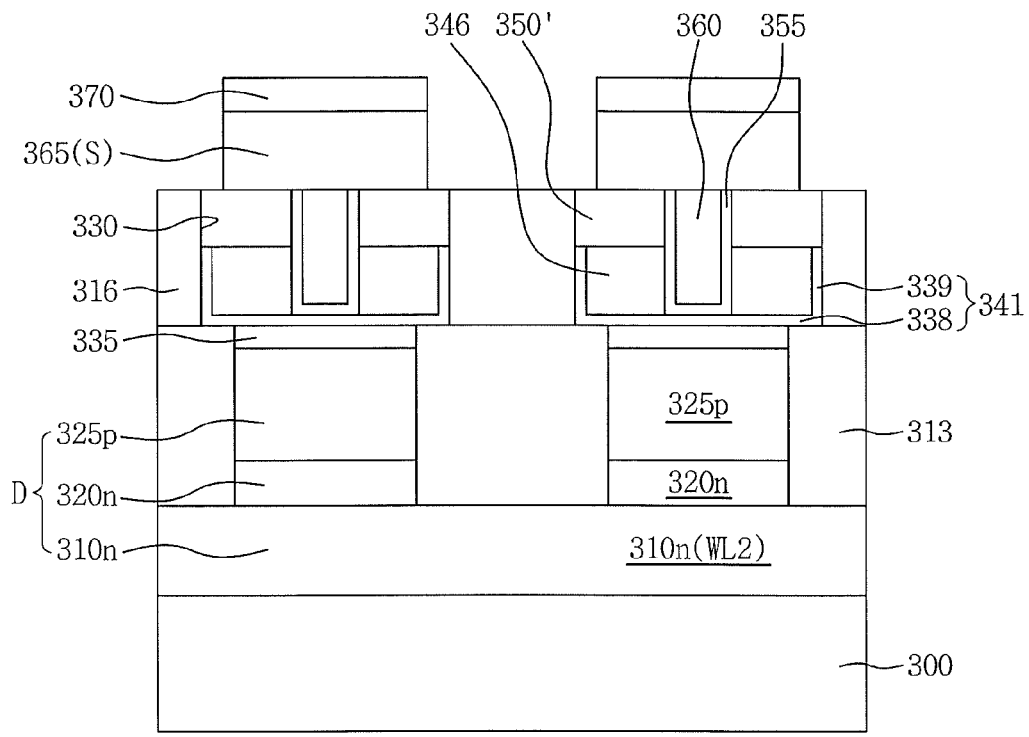
Figure 22B:
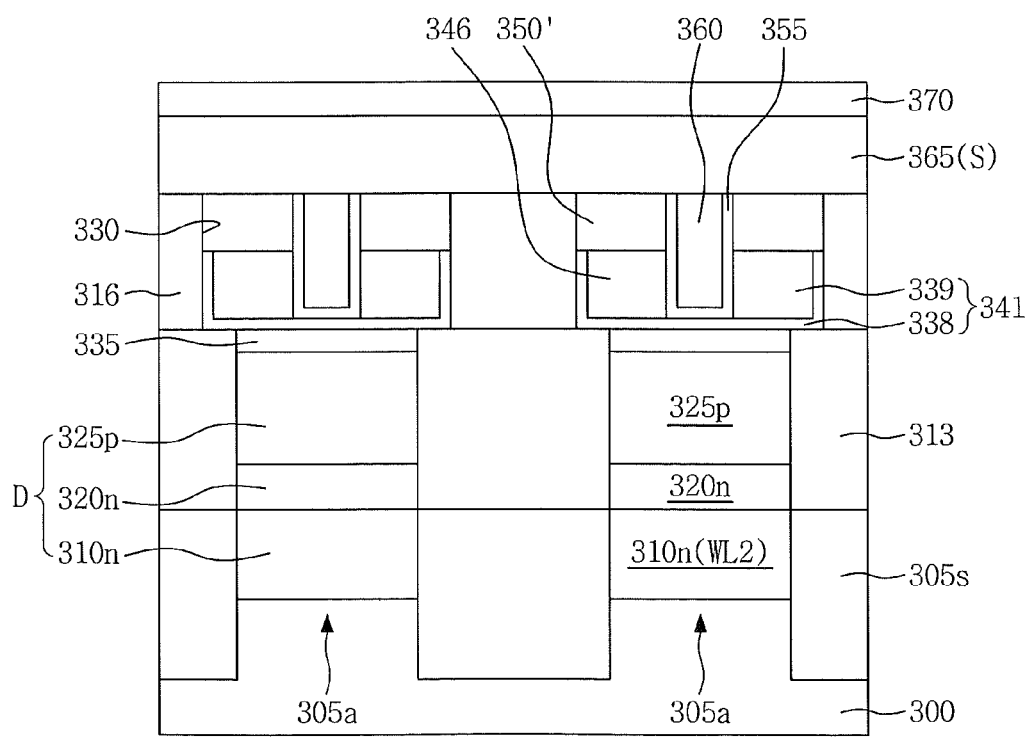

Referring to FIGS. 22A and 22B, a buffer layer may be formed on the substrate having the intermediate metal layer 340 as illustrated in FIGS. 14A and 14B.

In some embodiments, the a similar method as illustrated in FIG. 20B may be performed on the substrate having the buffer layer formed on the intermediate metal layer 340. As a result, an intermediate conductive pattern 341 having a greater width than the lower conductive pattern 335 may be formed on the lower conductive patterns 335. Each of the intermediate conductive patterns 341 may include a first portion 338 and a second portion 339 that protrudes upwardly protruding from an end of the first portion 338. Also, a buffer pattern 346, a spacer pattern 350', an upper conductive pattern 355, an insulating pattern 360, an information storage material pattern 365 and an upper electrode 370 corresponding to the buffer pattern 246, the spacer pattern 250', the upper conductive pattern 255, the insulating pattern 260, the information storage material pattern 265 and the upper electrode 270 illustrated in FIGS. 20A and 20B may be formed. Therefore, further descriptions thereof will be omitted.

In other embodiments, as illustrated in FIGS. 16A and 16B, the formation of the buffer pattern 346 may be omitted. Therefore, the spacer pattern 350' may be formed by extending to a place where the buffer pattern 346 is to be formed.

Next, methods of fabricating a semiconductor device according to yet other embodiments of the inventive concept and a semiconductor device fabricated using the same will be described below with reference to FIGS. 23A through 25B.

Figure 23A:
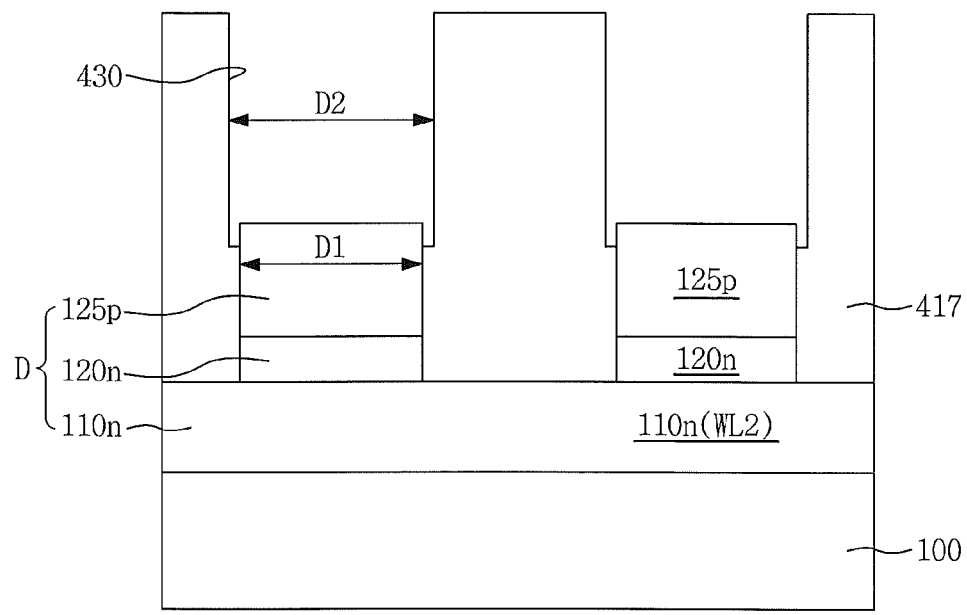
FIGS. 23A through 25B are cross-sectional views illustrating a method of fabricating a semiconductor device according to yet other embodiments of the inventive concept.
Figure 23B:
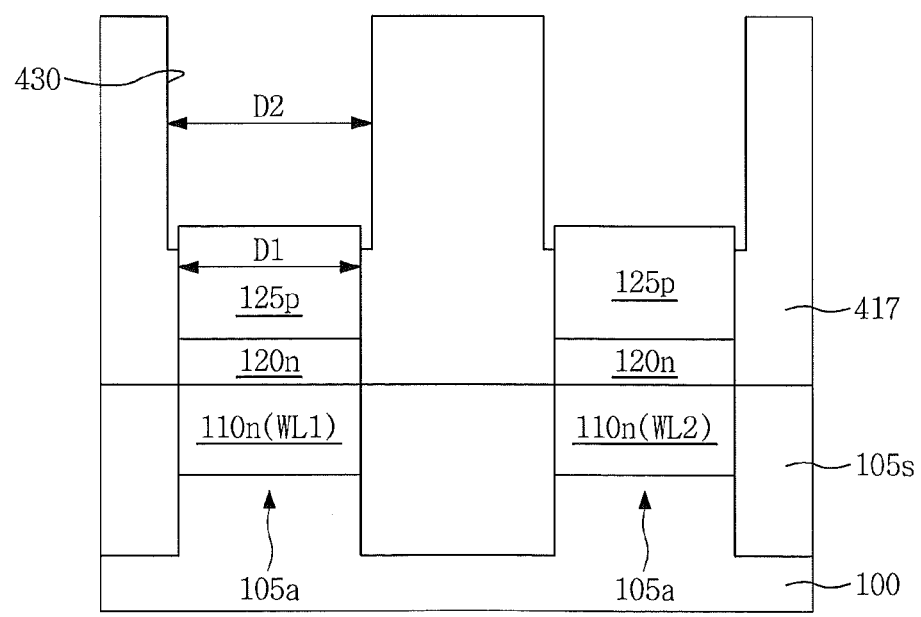

Referring to FIGS. 12, 23A and 23B, a similar substrate as described in FIGS. 13A and 13B may be prepared. As described in FIGS. 13A and 13B, isolation regions 105s defining a plurality of active regions 105a may be formed in a predetermined region of a semiconductor substrate 100. First impurity regions 110 may be formed in the active regions 105a. A first interlayer insulating layer 417 may be formed on the entire surface of the semiconductor substrate having the first impurity regions 110n. The first interlayer insulating layer 417 may include a silicon oxide layer. The first interlayer insulating layer 417 may be patterned to form a plurality of holes exposing predetermined regions of the first impurity regions 110n.

As illustrated in FIGS. 13A and 13B, semiconductor patterns partially filling the holes may be formed, and a buffer impurity region 120n and a second impurity region 125p, which are sequentially stacked in each of the semiconductor patterns, may be formed. The first impurity regions 110n, the buffer impurity region 120n and the second impurity region 125p may constitute a cell diode D.

The widths of each of the holes in the first interlayer insulating layer 417 may be expanded. For example, a process of etching the first interlayer insulating layer 417, e.g., a cleansing process and/or an etching process may be performed. Therefore, expanded holes 430 having a width D2 greater than a width D1 of the semiconductor pattern may be formed in the first interlayer insulating layer 417. Therefore, the expanded holes 430 may cause top surfaces and sidewalls of the second impurity regions 125p to be partially exposed.

Figure 24A:
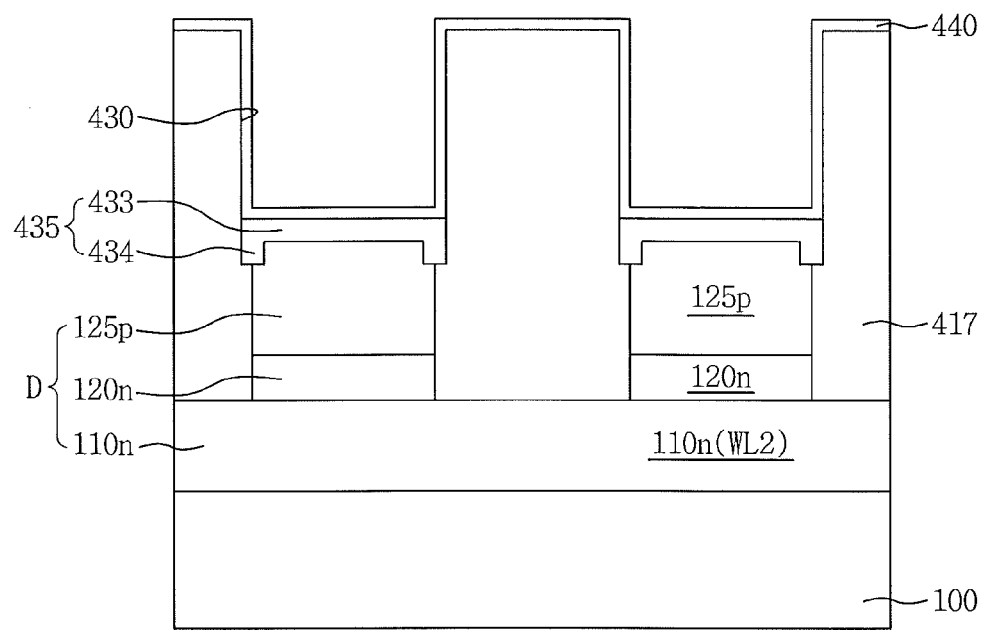
Figure 24B:
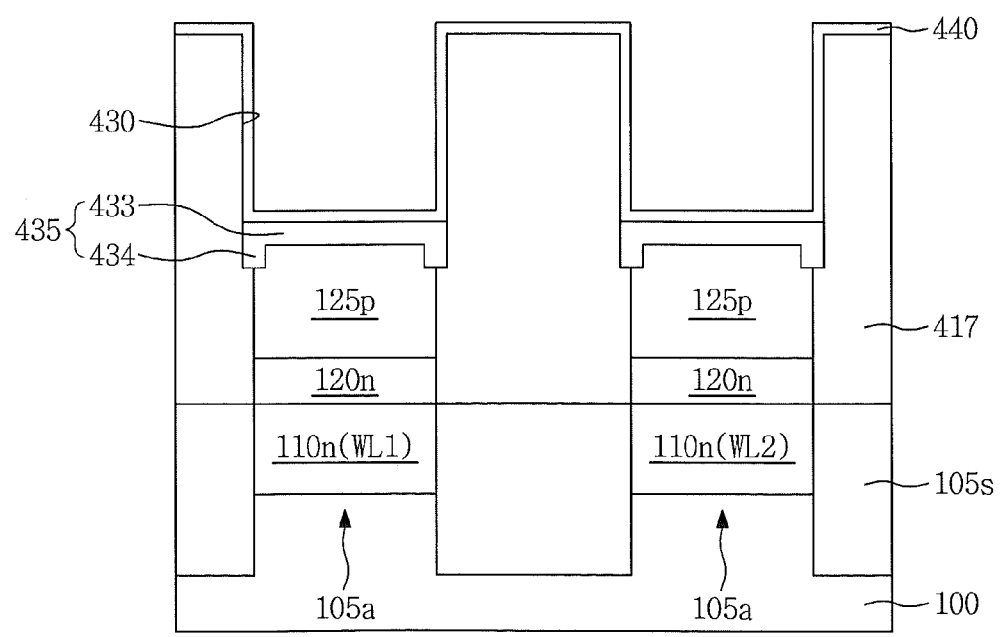

Referring to FIGS. 24A and 24B, a silicide process may be performed to form lower conductive patterns 435 on the second impurity region 125p exposed by the expanded holes 430. Each of the lower conductive patterns 435 may include a first portion 433 formed on the second impurity region 125p and a second portion 434 formed on the exposed sidewall of the second impurity region 125p. That is, the lower conductive patterns 435 may be formed in a substantially similar manner as the lower conductive patterns 12e as illustrated in FIG. 5.

Then, an intermediate conductive layer 440 may be formed on the substrate having the lower conductive patterns 435.

Figure 25A:
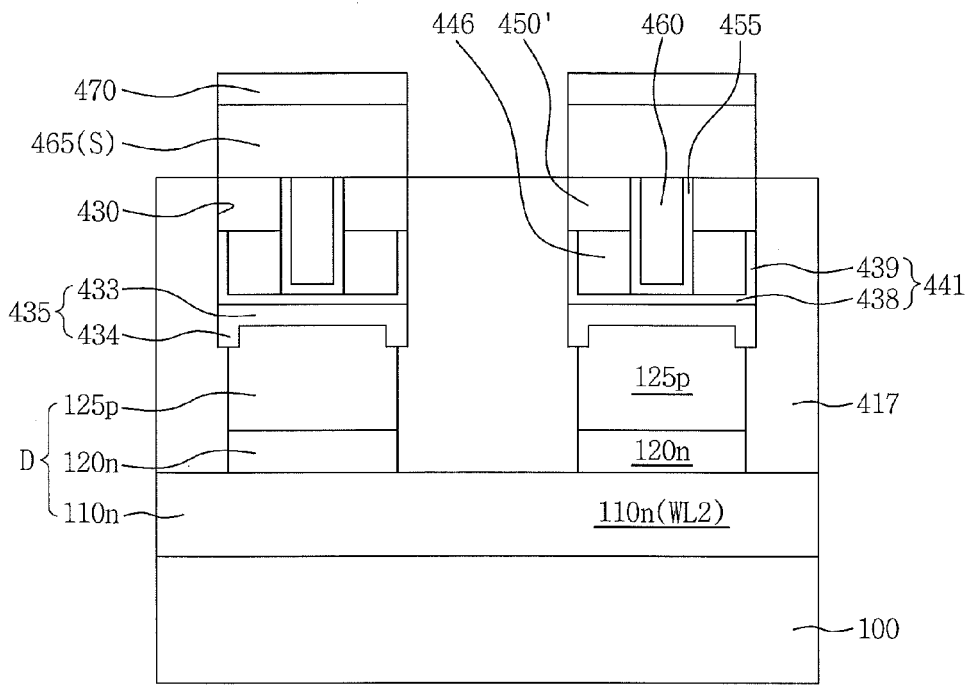
Figure 25B:
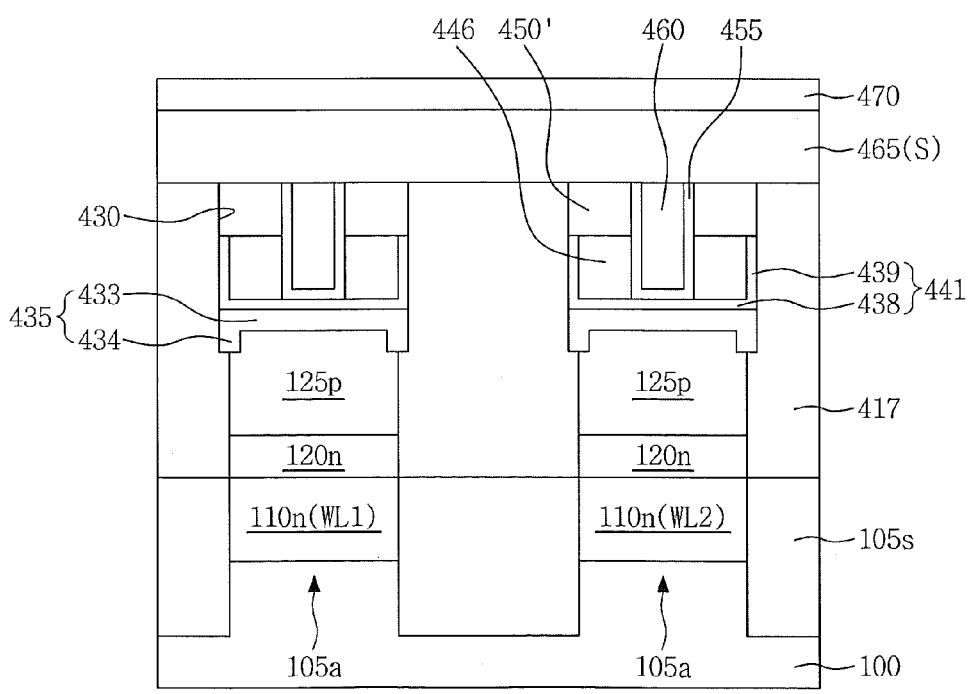

Referring to FIGS. 25A and 25B, a buffer layer may be formed on the substrate having the intermediate metal layer 440 in a manner similar to that described in FIGS. 14A and 14B.

In some embodiments, a similar method as described in FIG. 19A through 20B may be performed on the substrate having the buffer layer formed on the intermediate metal layer 440. As a result, intermediate conductive patterns 441 may be formed. Each of the intermediate conductive patterns 441 may include a first portion 438 and a second portion 439 upwardly protruding from an end of the first portion 438. The intermediate conductive patterns 441 may be vertically aligned with external sidewalls of the lower conductive patterns 435. Also, a buffer pattern 446, a spacer pattern 450', an upper conductive pattern 455, an insulating pattern 460, an information storage material pattern 465 and an upper electrode 470 corresponding to the buffer pattern 246, the spacer pattern 250', the upper conductive pattern 255, the insulating pattern 260, the information storage material pattern 265 and the upper electrode 270 illustrated in FIGS. 20A and 20B may be formed.

In other embodiments, as illustrated in FIGS. 16A and 16B, the buffer pattern 446 may be omitted. Therefore, the spacer pattern 450' may be formed by extending to a place where the buffer pattern 446 is to be formed.

Methods of fabricating a semiconductor device according to yet other embodiments of the inventive concept and a semiconductor device fabricated using the same will be described below with reference to FIGS. 26A through 27B.

Figure 26A:
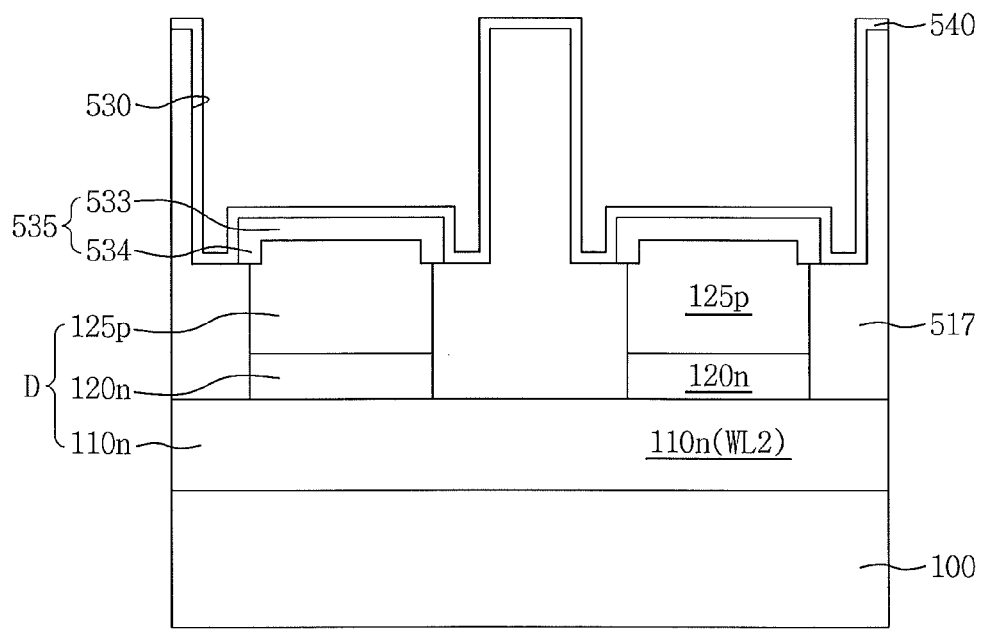
FIGS. 26A through 27B are cross-sectional views illustrating a method of fabricating a semiconductor device according to yet other embodiments of the inventive concept.
Figure 26B:
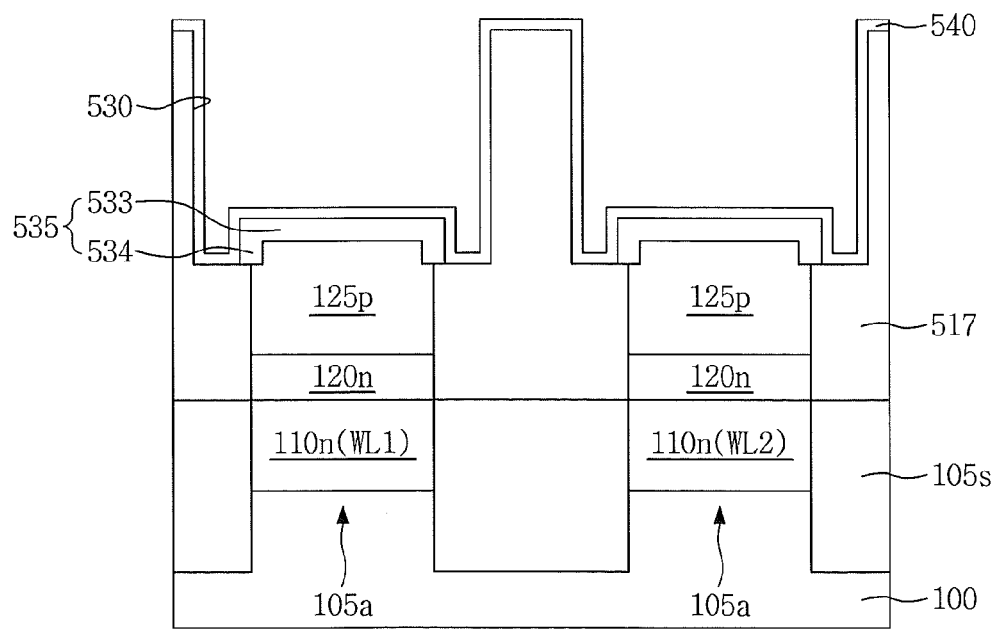

Referring to FIGS. 12, 26A and 26B, an interlayer insulating layer 517 having expanded holes 530 may be formed as illustrated in FIGS. 23A and 23B. The expanded holes 530 may cause a part of sidewalls and top surfaces of the second impurity regions 125p to be exposed.

A silicide process may be performed to form lower conductive patterns 535 on the second impurity region 125p exposed by the expanded holes 530. Each of the lower conductive patterns 535 may include a first portion 433 formed on a top surface of the second impurity region 125p and a second portion 534 formed on the exposed sidewall of the second impurity region 125p. That is, the lower conductive patterns 535 may be formed in a substantially similar manner as the lower conductive patterns 12g illustrated in FIG. 7.

Each of the expanded holes 530 in the interlayer insulating layer 517 may be formed to have a greater width than the holes 430 described in FIGS. 23A and 23B such that the sidewalls of the expanded holes are spaced apart from the lower conductive patterns 535.

An intermediate conductive layer 540 may be formed on the substrate having the lower conductive patterns 535.

Figure 27A:
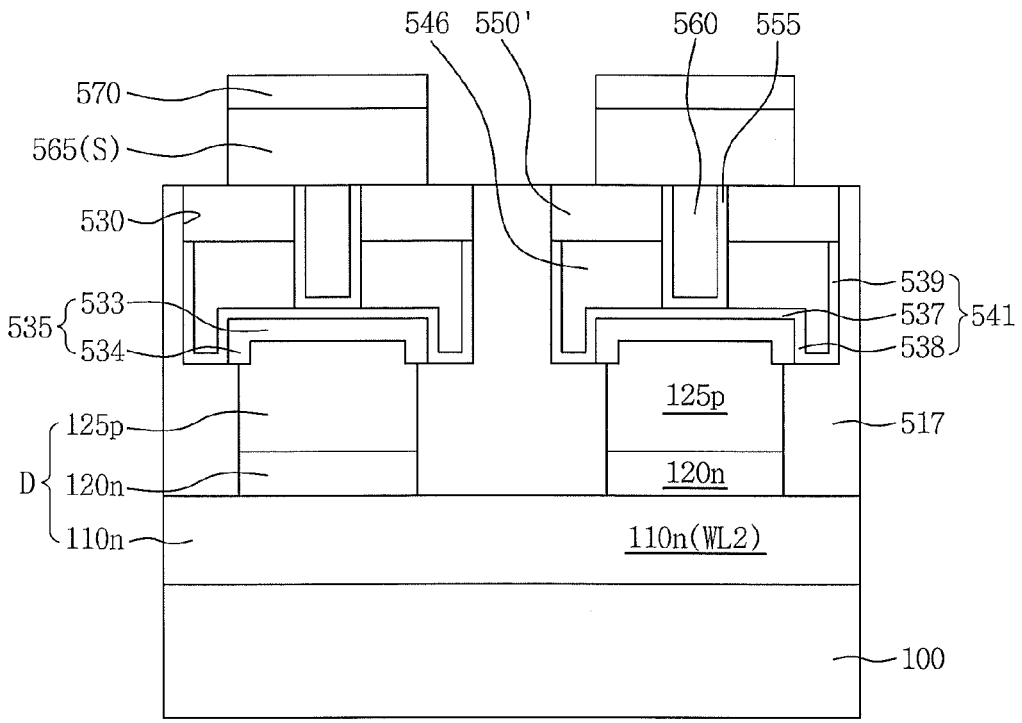
Figure 27B:
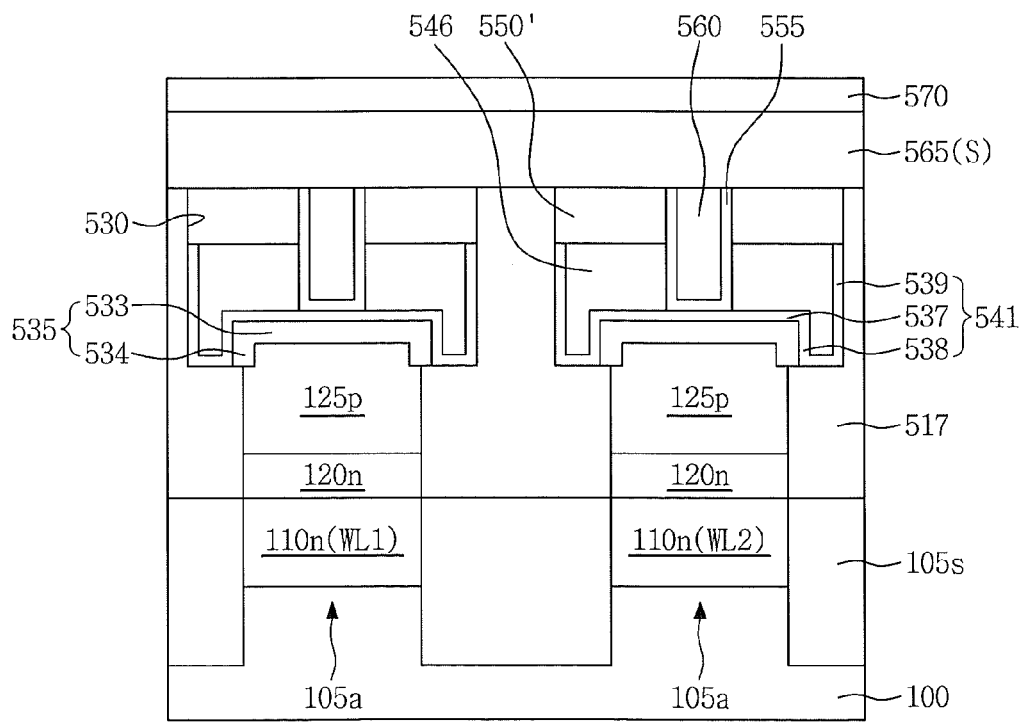

Referring to FIGS. 27A and 27B, a buffer layer may be formed on the substrate having the intermediate metal layer 540 as described in FIGS. 14A and 14B.

In some embodiments, a similar method as illustrated in FIG. 19A through 20B may be performed on the substrate having the buffer layer formed on the intermediate metal layer 540. As a result, intermediate conductive patterns 541 may be formed having a greater width than the lower conductive patterns 535 on the lower conductive patterns 535. Each of the intermediate conductive patterns 541 may include a first portion 538 and a second portion 539 upwardly protruding from an end of the first portion 538. Also, a buffer pattern 546, a spacer pattern 550', an upper conductive pattern 555, an insulating pattern 560, an information storage material pattern 565 and an upper electrode 570 corresponding to the buffer pattern 246, the spacer pattern 250', the upper conductive pattern 255, the insulating pattern 260, the information storage material pattern 265 and the upper electrode 270 illustrated in FIGS. 20A and 20B may be formed.

In other embodiments, as illustrated in FIGS. 16A and 16B, forming the buffer pattern 546 may be omitted. Therefore, the spacer pattern 550' may be formed by extending to a place where the buffer pattern 546 is to be formed.

Figure 28:
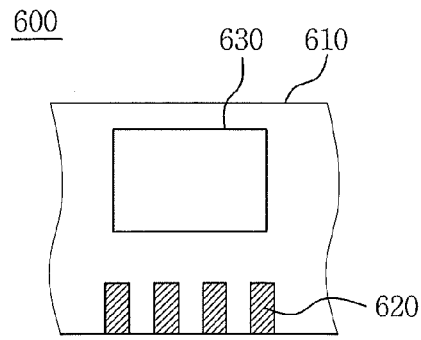
FIG. 28 is a schematic view of a memory card employing a semiconductor device according to some embodiments of the inventive concept.

FIG. 28 schematically illustrates a memory card. Referring to FIG. 28, a memory card 600 includes a card board 610, one or more semiconductor devices 630 disposed on the card board 610, and contact terminals 620 formed side by side at one edge of the card board 610 and electrically connected to the semiconductor devices 630, respectively. Here, the semiconductor devices 630 may be formed using a device and/or a method of fabricating the same according to at least one of the above-described embodiments of the inventive concept, and may be a memory chip including an information storage element or a semiconductor package. The memory card 600 may be a memory card used for an electronic device, e.g., a digital camera, a computer, a portable storage device, etc.

The card board 610 may be a printed circuit board (PCB). Both surfaces of the card board 610 may be used. That is, the semiconductor devices 630 may be disposed on both front and back sides of the card board 610. The semiconductor devices 630 may be disposed on a front side and/or a back side of the card board 610 to be electrically and mechanically connected thereto.

The contact terminals 620 may be formed of a metal, and may exhibit oxidation resistance. The contact terminals 620 may be variously set depending on types and standard specifications of the memory card 600. Therefore, the number of contact terminals 620 is not significant.

Figure 29:
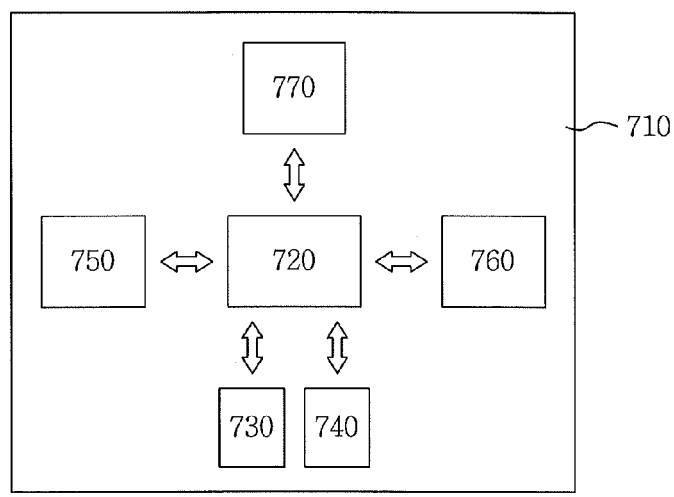
FIG. 29 is a schematic block diagram of an electronic circuit board employing a semiconductor device according to some embodiments of the inventive concept.

FIG. 29 is a schematic block diagram of an electronic circuit board. Referring to FIG. 29, an electronic circuit board 700 may be provided. The electronic circuit board 700 includes a microprocessor 720 disposed on a circuit board 710, a main storage circuit 730 and a supplementary storage circuit 740 communicating with the microprocessor 720, an input signal processing circuit 750 transmitting a command to the microprocessor 720, an output signal processing circuit 760 receiving a command from the microprocessor 620, and a communicating signal processing circuit 770 transmitting and receiving electrical signals to and from other circuit boards. It may be understood that arrows denote paths through which electrical signals are transmitted.

The microprocessor 720 may receive and process electrical signals, and output the results, and control other elements of the electronic circuit board 710. For example, the microprocessor 720 may be understood as a central processing unit (CPU) and/or a main control unit (MCU). The main storage circuit 730 may temporarily store data that the microprocessor 720 always and frequently requires or data processed or to be processed. Since the main storage circuit 730 requires a high-speed response, it may be formed of a semiconductor memory. The main storage circuit 730 may be a semiconductor memory referred to as a cache, and may be formed of a static random access memory (SRAM), a dynamic random access memory (DRAM), a resistive random access memory (RRAM) and applied semiconductor memories, e.g., utilized RAM, ferro-electric RAM, fast cycle RAM, phase changeable RAM (PRAM), magnetic RAM (MRAM), and other semiconductor memories. In addition, the main storage circuit is not related to volatility/non-volatility, and may include a random access memory.

Therefore, the main storage circuit 730 may include a memory device formed using a device and/or a method of fabricating the same according to at least one of the embodiments of the inventive concept. The main storage circuit 730 may include at least one semiconductor module. The supplementary storage circuit 740 may be a large-capacity memory device, and may be a non-volatile semiconductor memory such as a flash or phase-change memory or a hard disk drive using a magnetic field. Further, it may be a compact disk drive using light. Compared with the main storage circuit 730, the supplementary storage circuit 740 does not require the high speed, but it may be used when large-capacity data are stored The supplementary storage circuit 740 is not related to randomness/non-randomness, and may include a non-volatile memory device. The supplementary storage circuit 740 may include at least one semiconductor module. The input signal processing circuit 750 may convert an external command to an electrical signal, and may transmit an electrical signal transmitted from the outside to the microprocessor 720. The externally transmitted command or electrical signal may be an operating command, an electrical signal to be processed, or data to be stored. The input signal processing circuit 750 may be a terminal signal processing circuit processing signals transmitted from a keyboard, a mouse, a touch pad, an image recognition device or various sensors, an image signal processing circuit processing an image signal input from a scanner or a camera, various sensors or an input signal interface.

The output signal processing circuit 760 may be an element for transmitting an electrical signal processed by the microprocessor 720 to the outside. For example, the output signal processing circuit 760 may be a graphic card, an image processor, an optical converter, a beam panel card, or an interface circuit having various functions. The communicating signal processing circuit 770 may be an element for directly transmitting or receiving an electrical signal to or from another electronic system or another circuit board without the input signal processing circuit 750 or the output signal processing circuit 760. For example, the communicating signal processing circuit 770 may be a modem of a personal computer system, a LAN card or various interface circuits.

Figure 30:
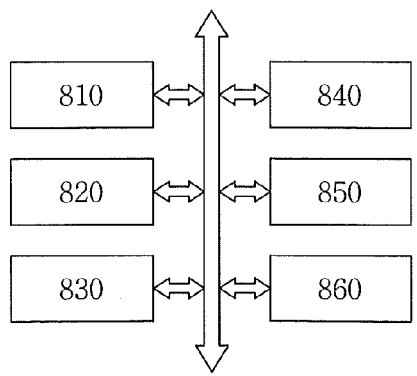
FIG. 30 is a schematic block diagram of an electronic system employing a semiconductor device according to some embodiments of the inventive concept.

FIG. 30 is a schematic block diagram of an electronic system. Referring to FIG. 30, an electronic system 800 may include a control unit 810, an input unit 820, an output unit 830, and a storage unit 840, and may further include a communication unit 850 and/or an operation unit 860.

The control unit 780 may generally control the electronic system 800 and each part. The control unit 810 may be interpreted as a central processing unit or a central control unit, and may include the electronic circuit board 800. The input unit 820 may transmit an electrical command signal to the control unit 810. The input unit 820 may be an image recognition device such, as a keyboard, a mouse, a touch pad, a scanner or various input sensors. The output unit 830 may output results that are processed by the electronic system 800 after receiving an electrical command signal from the control unit 810. The output unit 830 may be a monitor, a printer, a beam radiator or various mechanical devices. The storage unit 840 may be an element for temporarily or permanently storing an electrical signal processed or to be processed by the control unit 810. The storage unit 840 may be physically or electrically connected to or combined with the control unit 810. The storage unit 840 may be a semiconductor memory, a magnetic storage device such as a hard disk, an optical device such as a compact disk or a server functioning to store other data. The storage unit 840 may be a semiconductor memory that is formed using a device and/or a method of fabricating the same according to at least one of the embodiments of the inventive concept.

The communication unit 850 may receive an electronic command signal from the control unit 810 and transmit it to another electronic system or receive one therefrom. The communication unit 850 may be a wired transceiver such as a modem and a LAN card, a wireless transceiver such as a Wibro interface or an infrared port. The operation unit 860 may physically or mechanically operate depending on a command of the control unit 810. For example, the operation unit 860 may be an element that mechanically operates such as a floater, an indicator, an up/down operator, etc. The electronic system according to the inventive concept may be a computer, a network, a server, a networking printer or scanner, a wireless controller, a portable communication terminal, an exchanger or another electronic product that performs programmed operations.

Names and functions of elements whose reference marks are not indicated may be easily understood with reference to other drawings of the specification and the descriptions thereof.

According to embodiments of the inventive concept, an intermediate conductive pattern is provided between a lower conductive pattern and an upper conductive pattern. Here, the lower conductive patter and the upper conductive pattern may be formed of different kinds of materials, and the intermediate conductive pattern may be formed of a material exhibiting excellent interfacial resistance characteristics with the lower conductive patter and the upper conductive pattern. Further, the intermediate conductive pattern may include a first portion and a second portion upwardly protruding from a part of the first portion. The upper conductive pattern is formed on the first portion of the intermediate conductive pattern, and may be spaced apart from the second portion of the intermediate conductive pattern. Therefore, an intermediate conductive pattern capable of minimizing a vertical height between the lower and upper conductive patterns and improving electrical characteristics between the lower and upper conductive patterns can be provided. Consequently, a semiconductor device capable of enhancing electrical characteristics of a conductive structure formed of the lower, intermediate and upper conductive patterns can be provided.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A semiconductor device, comprising:
    a lower conductive pattern;
    an intermediate conductive pattern on the lower conductive pattern; and
    an upper conductive pattern on the intermediate conductive pattern;
    wherein the intermediate conductive pattern comprises a first portion and a second portion that extends from the first portion and that is disposed at a higher level from the lower conductive pattern than the first portion, and the upper conductive pattern is disposed directly on the first portion of the intermediate conductive pattern and has a top surface that is disposed at a higher level from the lower conductive pattern than the second portion of the intermediate conductive pattern and a bottom surface that is disposed at a lower level from the lower conductive pattern than the second portion of the intermediate conductive pattern.

2. The semiconductor device of claim 1, wherein the lower conductive pattern comprises a metal-semiconductor compound.

3. The semiconductor device of claim 1, wherein an external sidewall of the intermediate conductive pattern is vertically aligned with a sidewall of the lower conductive pattern.

4. The semiconductor device of claim 1, wherein the intermediate conductive pattern has a greater width than the lower conductive pattern.

5. The semiconductor device of claim 1, wherein the first portion of the intermediate conductive pattern covers a top surface of the lower conductive pattern, and the second portion of the intermediate conductive pattern protrudes upwardly from an end of the first portion of the intermediate conductive pattern.

6. The semiconductor device of claim 1, wherein the intermediate conductive pattern further comprises a third portion interposed between the first portion and the second portion and covering a part of a sidewall of the lower conductive pattern.

7. The semiconductor device of claim 1, wherein the upper conductive pattern is in contact with the first portion of the intermediate conductive pattern.

8. The semiconductor device of claim 1, wherein the upper conductive pattern comprises:
    a first portion on the first portion of the intermediate conductive pattern and disposed at a lower level than a top surface of the second portion of the intermediate conductive pattern; and
    a second portion that protrudes upwardly from a part of the first portion and that is disposed at a higher level from the lower conductive pattern than the top surface of the second portion of the intermediate conductive pattern.

9. The semiconductor device of claim 1, wherein the lower conductive pattern comprises a first portion and a second portion that extends downwardly from an end of the first portion.

10. The semiconductor device of claim 1, further comprising a buffer pattern interposed between the second portion of the intermediate conductive pattern and an external sidewall of the upper conductive pattern.

11. An electronic system, comprising:
    a control unit; and
    a storage unit electrically connected to the control unit, wherein the storage unit comprises a semiconductor device as claimed in claim 1.

12. A semiconductor device, comprising:
a switching device provided on a semiconductor substrate and including a first impurity region and a second impurity region on the first impurity region;
a lower conductive pattern on the second impurity region;
an intermediate conductive pattern on the lower conductive pattern;
an upper conductive pattern on the intermediate conductive pattern; and
an information storage material pattern on the upper conductive pattern,
wherein the intermediate conductive pattern comprises a first portion and a second portion that extends from a part of the first portion and that is disposed at a higher level from the lower conductive pattern than the first portion, and the upper conductive pattern is disposed on the first portion of the intermediate conductive pattern and has a top surface that is disposed at a higher level form the lower conductive pattern than the second portion of the intermediate conductive pattern.

13. The semiconductor device of claim 12, wherein the lower conductive pattern comprises a metal-semiconductor compound.

14. The semiconductor device of claim 12, wherein an external sidewall of the intermediate conductive pattern is vertically aligned with a sidewall of the lower conductive pattern.

15. The semiconductor device of claim 12, wherein the intermediate conductive pattern has a greater width than the lower conductive pattern.

16. The semiconductor device of claim 12, wherein the first portion of the intermediate conductive pattern covers a top surface of the lower conductive pattern, and the second portion of the intermediate conductive pattern protrudes upwardly from an end of the first portion of the intermediate conductive pattern.

17. The semiconductor device of claim 12, wherein the intermediate conductive pattern further comprises a third portion interposed between the first portion and the second portion and covering a part of a sidewall of the lower conductive pattern.

18. The semiconductor device of claim 12, wherein the lower conductive pattern comprises a first portion and a second portion that extends downwardly from an end of the first portion.

19. The semiconductor device of claim 12, further comprising an insulating spacer pattern surrounding an external sidewall of the upper conductive pattern and interposed between the intermediate conductive pattern and the information storage material pattern.

20. The semiconductor device of claim 12, further comprising:
a buffer pattern interposed between an external sidewall of the upper conductive pattern and the second portion of the intermediate conductive pattern; and
a spacer pattern interposed between the buffer pattern and the information storage material pattern.

* * * * *